(12) United States Patent
Park et al.

(10) Patent No.: US 12,232,429 B2
(45) Date of Patent: Feb. 18, 2025

(54) SEMICONDUCTOR DEVICE INCLUDING DATA STORAGE MATERIAL PATTERN

(71) Applicant: Samsung Electronics Co., Ltd., Suwon-si (KR)

(72) Inventors: Jeonghee Park, Hwaseong-si (KR); Dongho Ahn, Hwaseong-si (KR); Wonjun Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 745 days.

(21) Appl. No.: 17/384,933

(22) Filed: Jul. 26, 2021

(65) Prior Publication Data

US 2022/0085286 A1    Mar. 17, 2022

(30) Foreign Application Priority Data

Sep. 15, 2020    (KR) .................. 10-2020-0118176

(51) Int. Cl.
*H10N 70/20* (2023.01)
*H10B 63/00* (2023.01)
*H10N 70/00* (2023.01)

(52) U.S. Cl.
CPC .......... *H10N 70/231* (2023.02); *H10B 63/80* (2023.02); *H10N 70/841* (2023.02); *H10N 70/8828* (2023.02)

(58) Field of Classification Search
CPC ................................................ H10N 70/231
See application file for complete search history.

(56) References Cited

U.S. PATENT DOCUMENTS

| 7,923,286 B2 | 4/2011 | Chen et al. |
| 8,237,141 B2 | 8/2012 | Kang et al. |
| 8,320,170 B2 | 11/2012 | Hwang et al. |

(Continued)

FOREIGN PATENT DOCUMENTS

| KR | 10-2008-0068282 A | 7/2008 |
| KR | 10-2017-0048968 A | 5/2017 |

OTHER PUBLICATIONS

Korean Office Action dated Nov. 6, 2024 for corresponding Korean Patent Application No. 10-2020-0118176 and its English-language translation.

*Primary Examiner* — Mounir S Amer
(74) *Attorney, Agent, or Firm* — HARNESS, DICKEY & PIERCE, P.L.C.

(57) ABSTRACT

A semiconductor device includes a first conductive line on a lower structure and extending in a first horizontal direction; a second conductive line on the first conductive line and extending in a second horizontal direction, the second horizontal direction being perpendicular to the first horizontal direction; and a memory cell structure between the first conductive line and the second conductive line. The memory cell may structure include a data storage material pattern and a selector material pattern overlapping the data storage material pattern in a vertical direction. The data storage material pattern may include a phase change material layer of $In_\alpha Ge_\beta Sb_\gamma Te_\delta$. In the phase change material layer of $In_\alpha Ge_\beta Sb_\gamma Te_\delta$, a sum of $\alpha$ and $\beta$ may be lower than about 30 at. %, and a sum of $\gamma$ and $\delta$ may be higher than about 70 at. %.

17 Claims, 27 Drawing Sheets

(56) References Cited

U.S. PATENT DOCUMENTS

| | | |
|---|---|---|
| 8,981,330 B2 | 3/2015 | Lung |
| 9,082,970 B2 | 7/2015 | Soeya et al. |
| 9,768,232 B2 | 9/2017 | Eun |
| 10,381,366 B1 * | 8/2019 | Takahashi ............... H10B 63/20 |
| 10,388,867 B2 | 8/2019 | Wu et al. |
| 10,573,807 B2 | 2/2020 | Chen et al. |
| 11,769,538 B2 * | 9/2023 | Dodge ................. G11C 13/003 |
| | | 365/230.06 |
| 2008/0175042 A1 | 7/2008 | Kang et al. |
| 2008/0258128 A1 | 10/2008 | Kuh et al. |
| 2010/0015755 A1 | 1/2010 | Matsui et al. |
| 2012/0235110 A1 * | 9/2012 | Sutou ................... G11B 7/2433 |
| | | 257/E45.001 |
| 2017/0117328 A1 * | 4/2017 | Terai .................... H10N 70/231 |
| 2019/0259772 A1 | 8/2019 | Takahashi et al. |
| 2020/0194452 A1 * | 6/2020 | Xiao ................. H01L 23/5226 |
| 2021/0066587 A1 * | 3/2021 | Trinh ................. H10N 70/8836 |

\* cited by examiner

SEMICONDUCTOR DEVICE INCLUDING DATA STORAGE MATERIAL PATTERN

CROSS-REFERENCE TO RELATED APPLICATION(S)

This application claims benefit of priority to Korean Patent Application No. 10-2020-0118176, filed on Sep. 15, 2020 in the Korean Intellectual Property Office, the disclosure of which is incorporated herein by reference in its entirety.

BACKGROUND

Inventive concepts relate to a semiconductor device including a data storage material pattern.

Next-generation memory devices such as PRAM, RRAM, or the like are being developed according to the trend for higher performance and low power consumption of semiconductor devices such as memory devices. Such next-generation memory devices are formed using a data storage material capable of changing a resistance value according to a current or voltage, and maintaining the resistance value even when supply of the current or voltage is cut off.

SUMMARY

Embodiments of inventive concepts provide a semiconductor device including a data storage material pattern.

According to an embodiment of inventive concepts, a semiconductor device may include a lower structure; a first conductive line on the lower structure and extending in a first horizontal direction; a second conductive line on the first conductive line and extending in a second horizontal direction, the second horizontal direction being perpendicular to the first horizontal direction; and a memory cell structure between the first conductive line and the second conductive line. The memory cell structure may include a data storage material pattern and a selector material pattern overlapping the data storage material pattern in a vertical direction. The data storage material pattern may include a phase change material layer of $In_\alpha Ge_\beta Sb_\gamma Te_\delta$. In the phase change material layer of $In_\alpha Ge_\beta Sb_\gamma Te_\delta$, a sum of a and β may be lower than about 30 at. %, and a sum of γ and δ may be higher than about 70 at. %.

According to an embodiment of inventive concepts, a semiconductor device may include a lower structure including a semiconductor substrate, a circuit device on the semiconductor substrate, and a lower insulating structure on the semiconductor substrate and covering the circuit device; and a plurality of memory cell structures on the lower structure and stacked in a vertical direction. The plurality of memory cell structures may include a data storage material pattern and a selector material pattern overlapping the data storage material pattern in the vertical direction, respectively. The data storage material pattern may include a phase change material layer of $In_\alpha Ge_\beta Sb_\gamma Te_\delta$. In the phase change material layer of $In_\alpha Ge_\beta Sb_\gamma Te_\delta$, a sum of a and β may be lower than about 30 at. % and a sum of γ and δ may be higher than about 70 at. %.

According to an embodiment of inventive concepts, a semiconductor device may include a lower structure including a row driver, a column driver, and a control logic electrically connected to the row driver and the column driver; an upper structure on the lower structure; a first contact structure; a second contact structure; and an input/output contact structure. The upper structure may include a first conductive line on the lower structure, a second conductive line on the first conductive line, and a first memory cell structure between the first conductive line and the second conductive line. The first contact structure may electrically connect the first conductive line to the row driver. The second contact structure may electrically connect the second conductive line to the column driver. The input/output contact structure may pass through the upper structure and extend into the lower structure. The input/output contact structure may be electrically connected to the control logic. The first memory cell structure may include a data storage material pattern and a selector material pattern overlapping the data storage material pattern in a vertical direction. The data storage material pattern may include a phase change material layer of $In_\alpha Ge_\beta Sb_\gamma Te_\delta$. In the phase change material layer of $In_\alpha Ge_\beta Sb_\gamma Te_\delta$, a sum of a and β may be lower than about 30 at. %, and a sum of γ and δ may be higher than about 70 at. %.

BRIEF DESCRIPTION OF DRAWINGS

The above and other aspects, features, and effects of inventive concepts will be more clearly understood from the following detailed description, taken in conjunction with the accompanying drawings, in which.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Hereinafter, embodiments of inventive concepts will be described with reference to the accompanying drawings.

Figure 1:
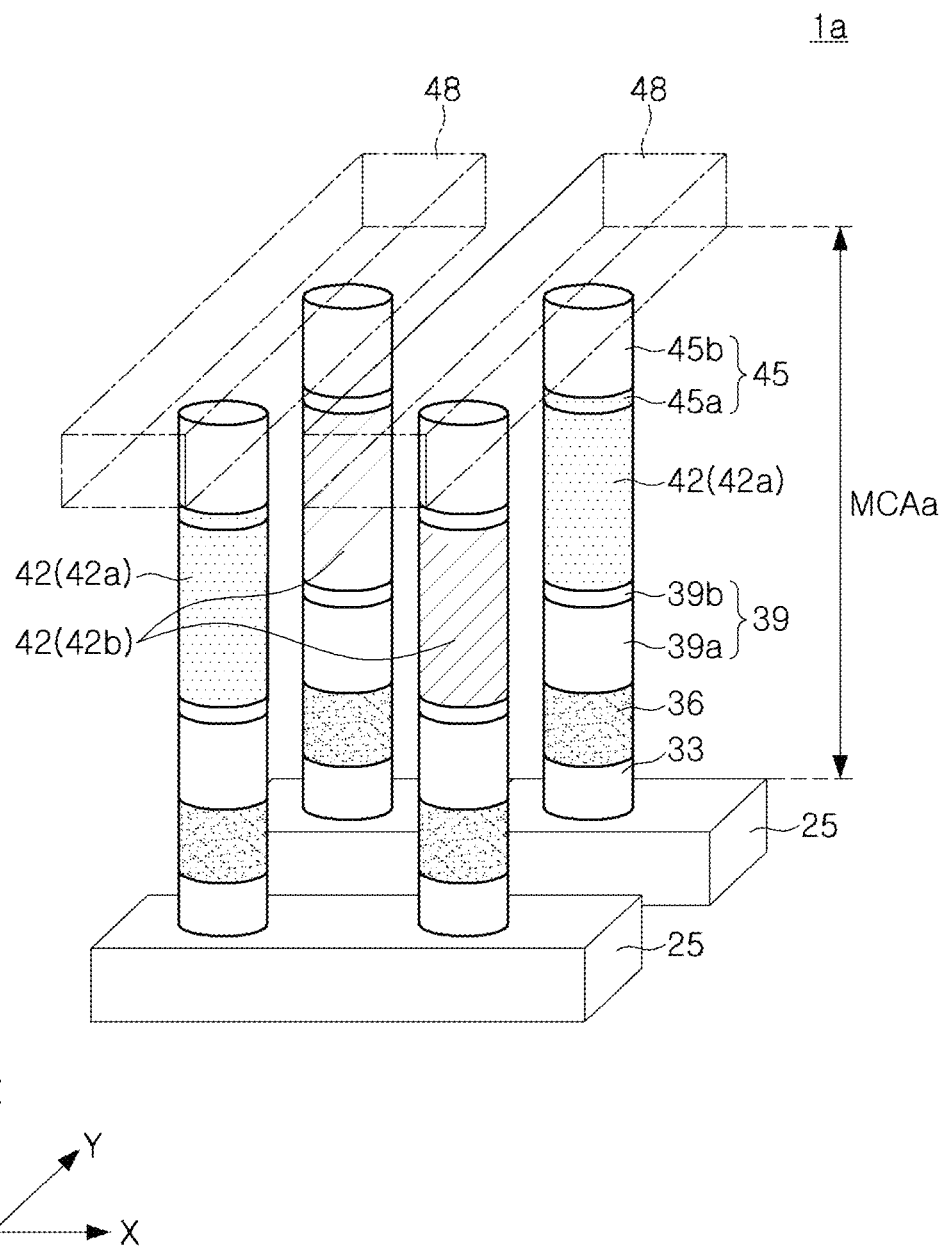
FIG. 1 is a perspective view schematically illustrating a semiconductor device according to an embodiment of inventive concepts.

First, a semiconductor device according to an embodiment of inventive concepts will be described with reference to FIG. 1. FIG. 1 is a perspective view schematically illustrating a semiconductor device according to an embodiment of inventive concepts.

Referring to FIG. 1, a semiconductor device 1a according to an embodiment includes first conductive lines 25, second conductive lines 48 disposed on the first conductive lines 25, and memory cell structures MCAa disposed between the first conductive lines 25 and the second conductive lines 48.

In an example, a planar shape of each of the memory cell structures MCAa may have a circular shape. However, embodiments of inventive concepts are not limited thereto. For example, the planar shape of each of the memory cell structures MCAa may have various shapes such as a square shape, a rectangular shape, a rectangular shape with rounded corners, or an elliptical shape.

Each of the first conductive lines 25 may have a linear shape extending in a first horizontal direction X. Each of the second conductive lines 48 may have a linear shape extending in a second horizontal direction Y, perpendicular to the first horizontal direction X.

In an example, the first conductive lines 25 may be word lines, and the second conductive lines 48 may be bit lines. In another example, the first conductive lines 25 may be bit lines, and the second conductive lines 48 may be word lines.

The memory cell structures MCAa may include a plurality of lower electrode patterns 33, a plurality of selector material patterns 36 disposed on the plurality of lower electrode patterns 33, a plurality of intermediate electrode patterns 39 disposed on the plurality of selector material patterns 36, a plurality of data storage material patterns 42 disposed on the plurality of intermediate electrode patterns 39, and a plurality of upper electrode patterns 45 disposed on the plurality of data storage material patterns 42. The plurality of data storage material patterns 42 may overlap each of the plurality of selector material patterns 36 in a vertical direction Z.

Each of the plurality of data storage material patterns 42 may include a phase change material. For example, each of the plurality of data storage material patterns 42 may include a phase change material such as $In_\alpha Ge_\beta Sb_\gamma Te_\delta$ material.

In an example, in the $In_\alpha Ge_\beta Sb_\gamma Te_\delta$ material, the sum of $\alpha$ and $\beta$ may be lower than about 30 at. %, and the sum of $\gamma$ and $\delta$ may be higher than about 70 at. %.

In an example, in the $In_\alpha Ge_\beta Sb_\gamma Te_\delta$ material, the sum of $\alpha$ and $\beta$ may be equal to or lower than about 20 at. %. The sum of $\gamma$ and $\delta$ may be equal to or higher than about 80 at. %. $\gamma$ may be about 30 at. %, and $\delta$ may be about 50 at. %. $\alpha$ may be equal to or higher than 10 about at. %, and may be equal to or lower than about 20 at. %.

In an example, $\beta$ may be less than $\alpha$.

In an example, each of the plurality of data storage material patterns 42 may further include an additional element. The additional element may include at least one of B, Al, Ga, Tl, C, Si, Sn, N, P, As, Bi, O, S, Se, Zn, Cd, W, Ti, Hf, or Zr.

According to an embodiment, a composition ratio of the $In_\alpha Ge_\beta Sb_\gamma Te_\delta$ material of the plurality of data storage material patterns 42 that may limit and/or prevent endurance characteristics of the semiconductor device 1a from deteriorating due to phase separation of the $In_\alpha Ge_\beta Sb_\gamma Te_\delta$ material into InTe, $In_2Te_3$, or the like during operation of the semiconductor device 1a, may be provided. In this case, the operation of the semiconductor device 1a may be a program operation and an erase operation. Therefore, the plurality of data storage material patterns 42 may include the $In_\alpha Ge_\beta Sb_\gamma Te_\delta$ material having the same composition ratio as described above, to limit and/or prevent durability from deteriorating while changing in phase from a crystalline phase to an amorphous phase, or from an amorphous phase to a crystalline phase.

In an embodiment, in the $In_\alpha Ge_\beta Sb_\gamma Te_\delta$ material of the plurality of data storage material patterns 42, the In element may increase resistance of the plurality of data storage material patterns 42, and the Ge element may limit and/or prevent phase separation of the $In_\alpha Ge_\beta Sb_\gamma Te_\delta$ material into InTe, $In_2Te_3$, or the like, to improve durability characteristics thereof.

In an embodiment, each of the plurality of data storage material patterns 42 may include the $In_\alpha Ge_\beta Sb_\gamma Te_\delta$ material having the same composition ratio as described above, to be used as a multi-level cell (MLC) in which one or more bits of data are stored in one (1) cell. Therefore, it may be possible to increase the data storage capacity of the semiconductor device 1a.

Each of the plurality of data storage material patterns 42 may include a phase change material layer capable of changing from a crystalline phase into an amorphous phase or from an amorphous phase into a crystalline phase, according to an operation of the semiconductor device 1a. For example, the plurality of data storage material patterns 42 may include a first data storage material pattern 42a having a first resistance and a second data storage material pattern 42b having a second resistance, higher than the first resistance, according to an operation of the semiconductor device 1a.

In an example, at least a portion of the first data storage material pattern 42a having the first resistance may be a crystalline phase. For example, a portion of the first data storage material pattern 42a may be a crystalline phase and a remaining portion thereof may be an amorphous phase. In another example, the first data storage material pattern 42a may be entirely a crystalline phase.

In an example, at least a portion of the second data storage material pattern 42b having the second resistance may be an amorphous phase. For example, the second data storage material pattern 42b may include a portion that is an amorphous phase and a portion that is a crystalline phase. For example, in the second data storage material pattern 42b, a central portion thereof may be an amorphous phase, and at least one of a lower region and an upper region thereof may be a crystalline phase. In another example, the second data storage material pattern 42b may be entirely an amorphous phase.

Each of the plurality of selector material patterns 36 may be a threshold switching device. For example, each of the plurality of selector material patterns 36 may be an ovonic threshold switching device (OTS).

Each of the plurality of selector material patterns 36 may include a chalcogenide-based ovonic threshold switching material capable of maintaining an amorphous phase, when the semiconductor device 1a is operated. For example, each of the plurality of selector material patterns 36 may be an alloy material containing at least two or more of an As element, an S element, an Se element, a Te element, or a Ge element, or additional elements (e.g., a Si element, an N element, etc.) that may maintain an amorphous phase in the alloy material at a higher temperature.

In an example, each of the plurality of selector material patterns 36 may include a switching material including at least one of a binary composition such as GeSe, GeS, AsSe, AsTe, AsS, SiTe, SiSe, SiS, GeAs, SiAs, SnSe, or SnTe, a ternary composition such as GeAsTe, GeAsSe, AlAsTe, AlAsSe, SiAsSe, SiAsTe, GeSeTe, GeSeSb, GaAsSe, GaAsTe, InAsSe, InAsTe, SnAsSe, or SnAsTe, a quaternary composition such as GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, or GeAsTeZn, a quinary composition such as GeSiAsSeTe, GeAsSeTeS, GeSiAsSeS, GeSiAsTeS, GeSi-SeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, or GeAs-SeZnSn, or a senary composition such as GeSiAsSeTeS, GeSiAsSeTeIn, GeSiAsSeTeGa, GeSiAsSeTeAl, GeSiAs-SeTeTl, GeSiAsSeTeZn, GeSiAsSeTeSn, GeSiAsSeTeP, GeSiAsSeSIn, GeSiAsSeSGa, GeSiAsSeSAl, GeSi-AsSeSTl, GeSiAsSeSZn, GeSiAsSeSSn, GeAsSeTeSIn, GeAsSeTeSGa, GeAsSeTeSAl, GeAsSeTeSTl, GeAs-SeTeSZn, GeAsSeTeSSn, GeAsSeTePIn, GeAsSeTePGa, GeAsSeTePAl, GeAsSeTePTl, GeAsSeTePZn, GeAs-SeTePSn, GeSiAsSeInGa, GeSiAsSeInAl, GeSiAsSeInTl, GeSiAsSeInZn, GeSiAsSeInSn, GeSiAsSeGaAl, GeSi-AsSeGaTl, GeSiAsSeGaZn, GeSiAsSeGaSn, GeSiAs-SeAlSn, GeAsSeTeInGa, GeAsSeTeInAl, GeAsSeTeInTl, GeAsSeTeInZn, GeAsSeTeInSn, GeAsSeTeGaAl, GeAs-SeTeGaTl, GeAsSeTeGaZn, GeAsSeTeGaSn, GeAs-SeTeAlSn, GeAsSeSInGa, GeAsSeSInAl, GeAsSeSInTl, GeAsSeSInZn, GeAsSeSInSn, GeAsSeSGaAl, GeAsSeS-GaTl, GeAsSeSGaZn, GeAsSeSGaSn, or GeAsSeSAlSn.

In an example, each of the plurality of selector material patterns 36 may be formed of one (1) switching material layer. In another example, each of the plurality of selector material patterns 36 may be formed of a plurality of switching material layers having different compositions.

In an example, in each of the plurality of selector material patterns 36, the switching material layer may further include an additional element. The additional element of the plurality of selector material patterns 36 may include at least one of B, C, N, or O.

Each of the memory cell structures MCAa may include one (1) lower electrode pattern 33, one (1) selector material pattern 36, one (1) intermediate electrode pattern 39, one (1) data storage material pattern 42, and one (1) upper electrode pattern 45, sequentially stacked in the vertical direction Z.

Hereinafter, a description will be made based on one (1) first conductive line 25, one (1) lower electrode pattern 33, one (1) selector material pattern 36, one (1) intermediate electrode pattern 39, one (1) data storage material pattern 42, one (1) upper electrode pattern 45, and one (1) second conductive line 48.

The lower electrode pattern 33 may be a carbon material layer or a carbon-containing material layer. In an example, the carbon-containing material layer may be a material layer including at least one of a nitrogen element or a metal element in the carbon material layer. For example, the carbon-containing material layer may be formed of a conductive material including a metal-based metal element such as W, Ti, or the like, and a carbon element, for example, a metal-carbon alloy material such as tungsten carbide (WC), titanium carbide (TiC), or the like. The metal element of the metal-carbon alloy material is not limited to the above-described W and Ti, and may be replaced by another metal element (e.g., Ta, Co, or the like) capable of forming an alloy with carbon (C).

Hereinafter, even when there is no separate description of the carbon-containing material layer, the carbon-containing material layer can be understood as being a conductive material including a carbon element together with at least one of a nitrogen element or a metal element, as described above.

The intermediate electrode pattern 39 may include a first intermediate electrode layer 39a and a second intermediate electrode layer 39b, sequentially stacked. The first intermediate electrode layer 39a may be thicker than the second intermediate electrode layer 39b. The first intermediate electrode layer 39a may be in contact with the selector material pattern 36, and the second intermediate electrode layer 39b may be in contact with the data storage material pattern 42. The first intermediate electrode layer 39a may be a carbon material layer or a carbon-containing material layer, and the second intermediate electrode layer 39b may be a metal layer or a metal alloy layer. For example, the second intermediate electrode layer 39b may include a conductive material such as W, WN, TiN, or the like.

The upper electrode pattern 45 may include a first upper electrode layer 45a and a second upper electrode layer 45b, sequentially stacked. The first upper electrode layer 45a may be thinner than the second upper electrode layer 45b. The first upper electrode layer 45a may be in contact with the data storage material pattern 42, and the second upper electrode layer 45b may be in contact with the second conductive line 48. The first upper electrode layer 45a may be a metal layer or a metal alloy layer. For example, the first upper electrode layer 45a may include a conductive material such as W, WN, TiN, or the like. The second upper electrode layer 45b may be a carbon material layer or a carbon-containing material layer.

Figure 2:
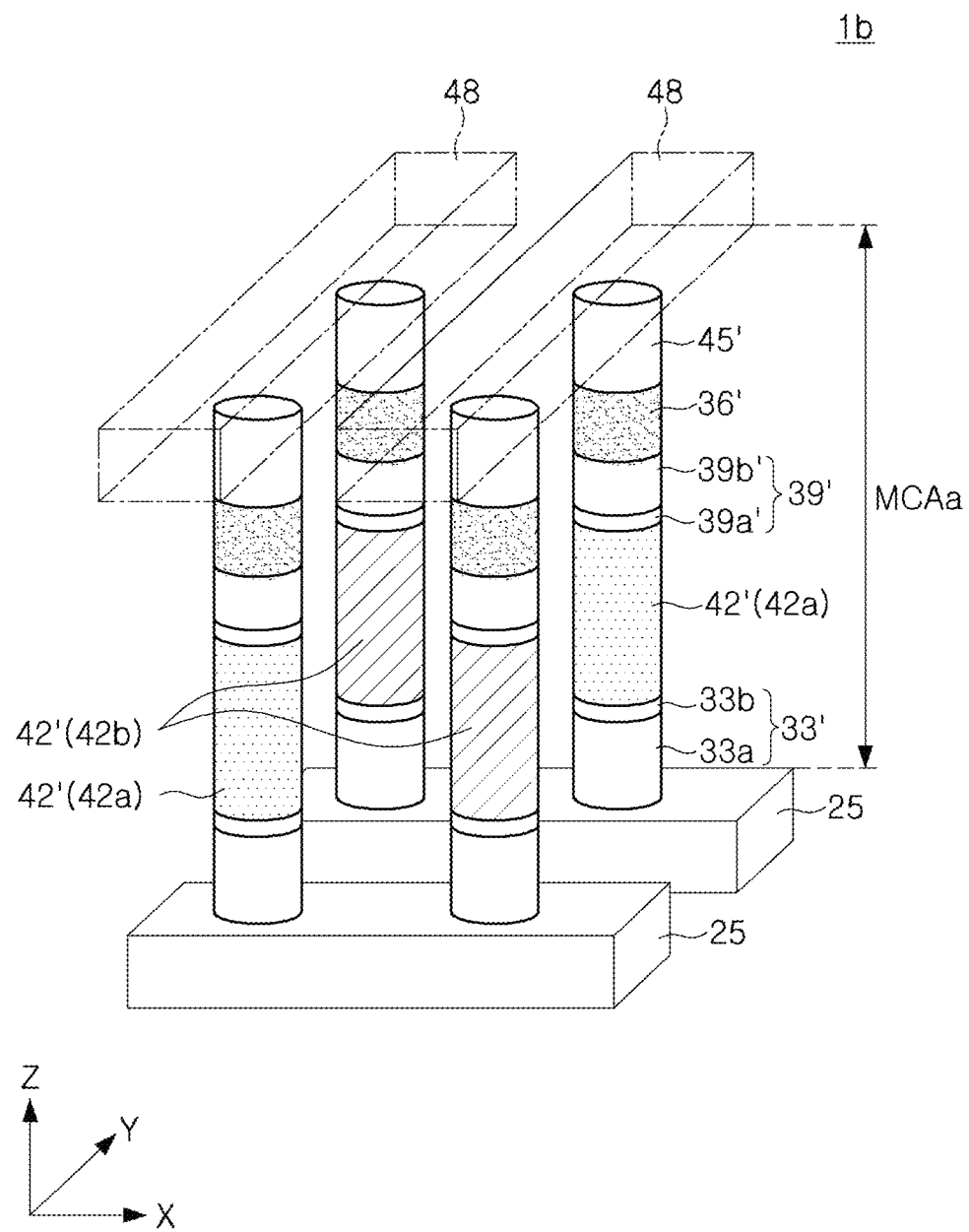
FIG. 2 is a perspective view schematically illustrating a modified example of a semiconductor device according to an embodiment of inventive concepts.

In an embodiment, between the first and second conductive lines 25 and 48, the data storage material pattern 42 may be disposed on the selector material pattern 36, but embodiments of inventive concepts are not limited thereto. For example, between the first and second conductive lines 25 and 48, the data storage material pattern 42 may be disposed below the selector material pattern 36. As described above, a modified example in which the data storage material pattern 42 is disposed below the selector material pattern 36 between the first and second conductive lines 25 and 48 will be explained in reference with FIG. 2. FIG. 2 is a perspective view schematically illustrating a modified example of a semiconductor device according to an embodiment of inventive concepts.

Referring to FIG. 2, a semiconductor device 1b according to an embodiment may include the first and second conductive lines 25 and 48, illustrated in FIG. 1, and memory cell structures MCAb disposed between the first conductive line 25 and the second conductive lines 48. Each of the memory cell structures MCAb may include a lower electrode pattern 33', a data storage material pattern 42', an intermediate electrode pattern 39', a selector material pattern 36', and an upper electrode pattern 45', sequentially stacked in the vertical direction Z.

The lower electrode pattern 33' may include a first lower electrode layer 33a, and a second lower electrode layer 33b on the first lower electrode layer 33a and having a thickness, less than a thickness of the first lower electrode layer 33a. The intermediate electrode pattern 39' may be a first intermediate electrode layer 39a', and a second intermediate electrode layer 39b' having a thickness, greater than a thickness of the first intermediate electrode layer 39a'. Each of the first lower electrode layer 33a, the second intermediate electrode layer 39b', and the upper electrode pattern 45' may be a carbon material layer or a carbon-containing material layer. Each of the second lower electrode layer 33b and the first intermediate electrode layer 39a' may be the same material as the second intermediate electrode layer (39b in FIG. 1) illustrated in FIG. 1, for example a metal layer or a metal alloy layer.

The data storage material pattern 42' may be the same material as the data storage material pattern (42 in FIG. 1) illustrated in FIG. 1, and the selector material pattern 36' may be the same material as the selector material pattern (36 in FIG. 1) illustrated in FIG. 1.

In the above-described embodiments, the memory cell structures (MCAa of FIG. 1 or MCAb of FIG. 2) may be disposed as a plurality of the memory cell structures in the vertical direction Z. Hereinafter, examples in which the memory cell structures (MCAa of FIG. 1) are disposed as a plurality of the memory cell structures in the vertical direction Z will be described. Hereinafter, a structure in which the data storage material pattern 42 is disposed on the selector material pattern 36 as illustrated in FIG. 1 will be described. Even when there is no separate description, embodiments of inventive concepts may include a structure in which the data storage material pattern 42' is disposed below the selector material pattern 36', as illustrated in FIG. 2.

Figure 3:
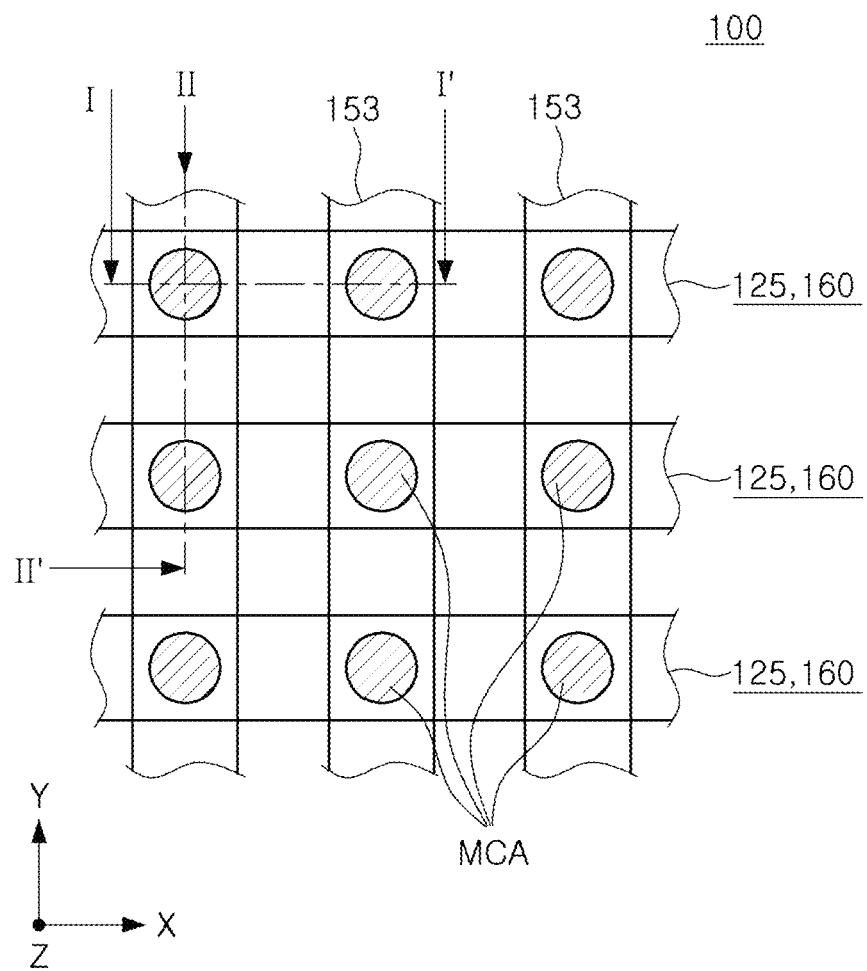
FIG. 3 is a plan view schematically illustrating a semiconductor device according to an embodiment of inventive concepts.

An example of a semiconductor device according to an embodiment of inventive concepts will be described with reference to FIGS. 3 to 5. FIG. 3 is a plan view schematically illustrating a semiconductor device according to an embodiment of inventive concepts, FIG. 4 is a cross-sectional view of FIG. 3, taken along lines I-I' and II-II', and FIG. 5 is a partially enlarged cross-sectional view of the first memory cell structures MCA_1 of FIG. 4.

Figure 4:
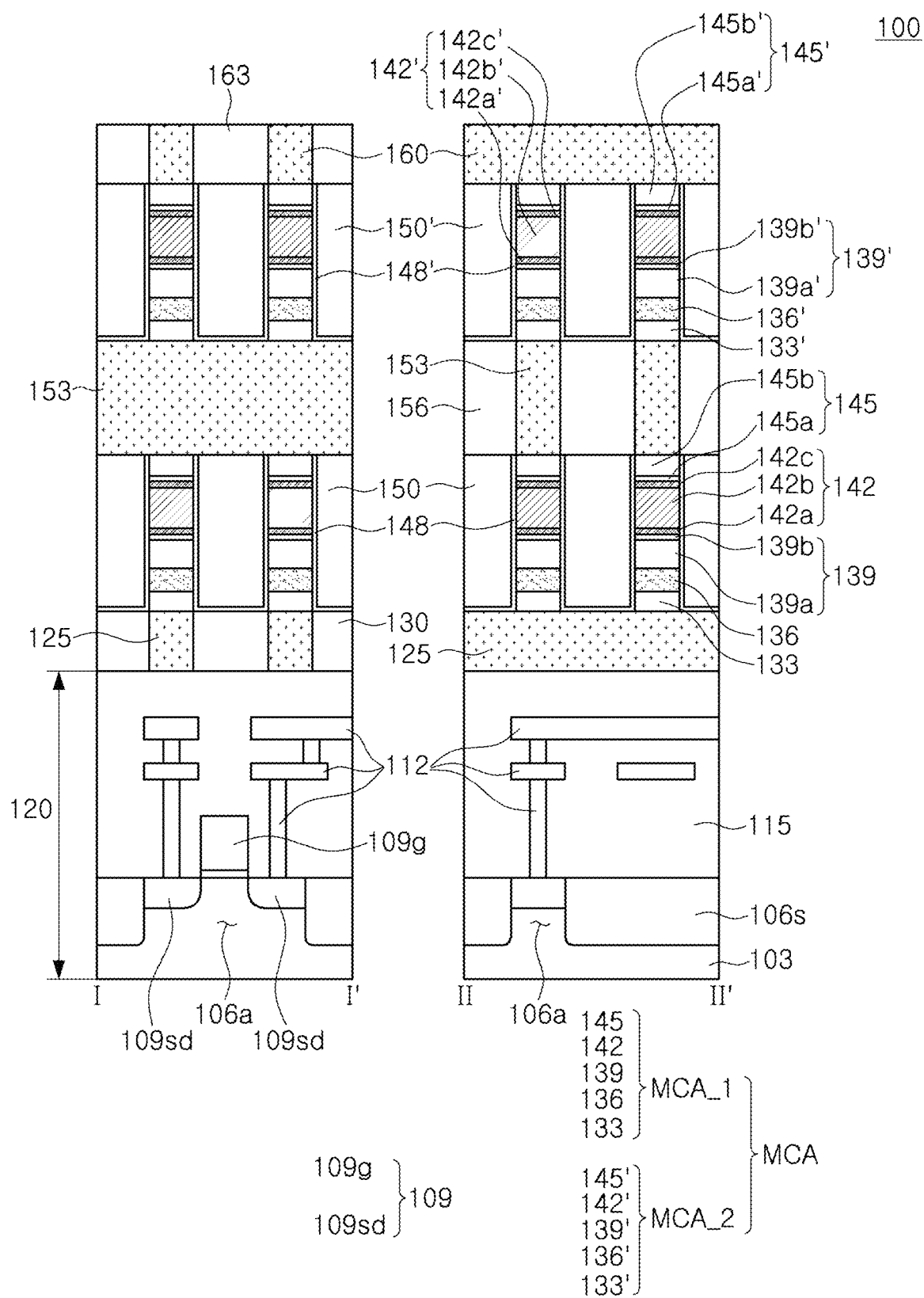
FIG. 4 is a cross-sectional view schematically illustrating a semiconductor device according to an embodiment of inventive concepts.
Figure 5:
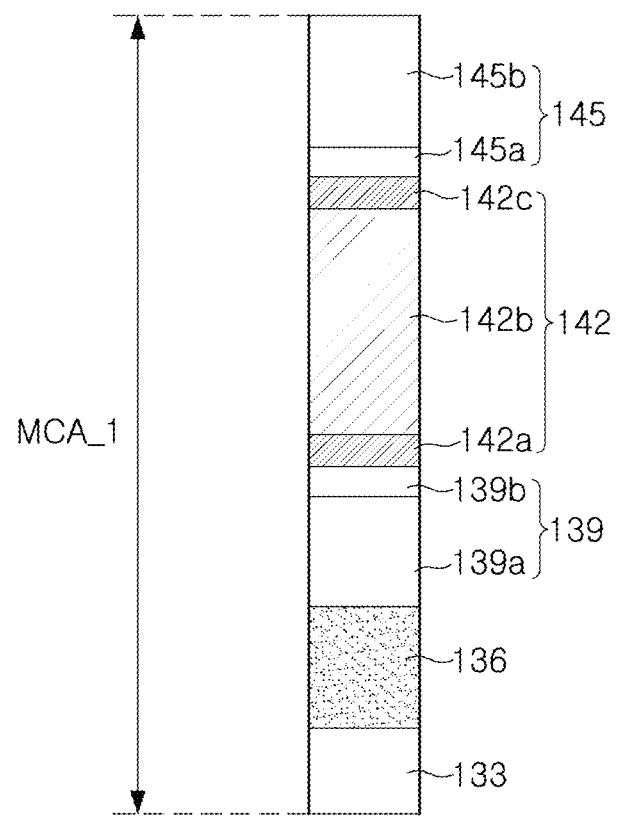
FIG. 5 is a partially enlarged cross-sectional view illustrating a memory cell structure of a semiconductor device according to an embodiment of inventive concepts.

Referring to FIGS. 3 and 4, a semiconductor device 100 according to an embodiment of inventive concepts may include a lower structure 120, a first conductive line 125 disposed on the lower structure 120, first memory cell structures MCA_1 disposed on the first conductive line 125, a second conductive line 153 disposed on the first memory cell structures MCA_1, second memory cell structures MCA_2 disposed on the second conductive line 153, and a third conductive line 160 disposed on the second memory cell structures MCA_2.

The lower structure 120 may include a semiconductor substrate 103, a circuit device 109 disposed on the semiconductor substrate 103, a circuit wiring 112 disposed on the semiconductor substrate 103 and electrically connected to the circuit device 109, and a lower insulating structure 115 disposed on the semiconductor substrate 103 and covering the circuit device 109 and the circuit wiring 112.

The circuit device 109 may include a transistor including a gate 109g disposed on the semiconductor substrate 103 and disposed on an active region 106a defined by a device isolation layer 106s, and source/drain regions 109sd disposed in the active region 106a on both sides of the gate 109g.

A semiconductor device 100 according to an embodiment may further include a first insulating pattern 130 covering a lateral surface of the first conductive line 125, a second insulating pattern 156 covering a lateral surface of the second conductive line 153, and a third insulating pattern 163 covering a lateral surface of the third conductive line 160.

A semiconductor device 100 according to an embodiment may further include a first gap-fill insulating pattern 150 surrounding lateral surfaces of the first memory cell structures MCA_1, a first capping insulating layer 148 disposed between the first gap-fill insulating pattern 150 and the first memory cell structures MCA_1, a second gap-fill insulating pattern 150' surrounding lateral surfaces of the second memory cell structures MCA_2, and a second capping insulating layer 148' disposed between the second gap-fill insulating pattern 150' and the second memory cell structures MCA_2.

In an example, the first capping insulating layer 148 may be extended to cover a lower surface of the first gap-fill insulating pattern 150 from between the first gap-fill insulating pattern 150 and the first memory cell structure MCA_1. The second capping insulating layer 148' may be extended to cover a lower surface of the second gap-fill insulating pattern 150' from between the second gap-fill insulating pattern 150' and the second memory cell structures MCA_2.

In an example, each of the first and second capping insulating layers 148 and 148' may include at least one of SiN, SiO$_2$, SiON, SiBN, SiCN, SiOCN, Al$_2$O$_3$, AlN, or AlON.

In an example, each of the first and second gap-fill insulating patterns 150 and 150' may include at least one of SiN, SiON, SiC, SiCN, SiOC, SiOCN, SiO$_2$, or Al$_2$O$_3$.

At least one of the first and second memory cell structures MCA_1 or MCA_2 may have substantially the same structure as the memory cell structures MCAa illustrated in FIG. 1 or the memory cell structures MCAb illustrated in FIG. 2. For example, each of the first memory cell structures MCA_1 may include a first lower electrode pattern 133, a first lower selector material pattern 136, a first intermediate electrode pattern 139, a first data storage material pattern 142, and a first upper electrode pattern 145. Each of the second memory cell structures MCA_2 may include a second lower electrode pattern 133', a second lower selector material pattern 136', a second intermediate electrode pattern 139', a second data storage material pattern 142', and a second upper electrode pattern 145'.

The first and second intermediate electrode patterns 139 and 139' may include first intermediate electrode layers 139a and 139a' and second intermediate electrode layers 139b and 139b', sequentially stacked, respectively. Each of the first intermediate electrode layers 139a and 139a' may be thicker than each of the second intermediate electrode layers 139b and 139b'. The first and second upper electrode patterns 145 and 145' may include first upper electrode layers 145a and 145a' and second upper electrode layers 145b and 145b', sequentially stacked, respectively. Each of the first upper electrode layers 145a and 145a' may be thinner than each of the second upper electrode layers 145b and 145b'.

In an example, each of the first and second lower electrode patterns 133 and 133' may include substantially the same material as the lower electrode pattern (33 in FIG. 1) illustrated in FIG. 1, each of the first and second intermediate electrode patterns 139 and 139' may include substantially the same material as the intermediate electrode pattern (39 in FIG. 1) illustrated in FIG. 1, and each of the first and second upper electrode patterns 145 and 145' may include substantially the same material as the upper electrode pattern (45 in FIG. 1) illustrated in FIG. 1.

In an example, each of the first and second data storage material patterns 142 and 142' may include substantially the same material as the data storage material pattern (42 in FIG. 1) illustrated in FIG. 1, and each of the first and second selector material patterns 136 and 136' may include substantially the same material as the selector material pattern (36 in FIG. 1) illustrated in FIG. 1.

In an example, the first conductive line 125 may have a first thickness, and the second conductive line 153 may have a second thickness, higher than the first thickness. The second thickness may be more than about 2 times and less than about 3 times the first thickness.

In an example, the first conductive line 125 may have a thickness of about 350 Å to about 450 Å, and the second conductive line 153 may have a thickness of about 750 Å to about 1100 Å.

In an example, each of the first and second selector material patterns 136 and 136' may have a thickness of about 100 Å to about 200 Å. Each of the data storage material patterns 142 and 142' may have a thickness of about 300 Å to about 450 Å.

In an example, each of the first and second data storage material patterns 142 and 142' may include a single phase change material layer.

In another example, each of the first and second data storage material patterns 142 and 142' may include a plurality of phase change material layers. For example, the first and second data storage material patterns 142 and 142' may include first phase change material layers 142a and 142a', second phase change material layers 142b and 142b', and third phase change material layers 142c and 142c', sequentially stacked, respectively.

The second phase change material layers 142b and 142b' may be disposed between the first phase change material layers 142a and 142a' and the third phase change material layers 142c and 142c', respectively. Each of the second phase change material layers 142b and 142b' may have a thickness greater than a thickness of each of the first phase change material layers 142a and 142a' and a thickness of each of the third phase change material layers 142c and 142c'.

In an example, the second phase change material layers 142b and 142b' may include the same material as the $In_\alpha Ge_\beta Sb_\gamma Te_\delta$ material of the data storage material pattern (42 in FIG. 1) illustrated in FIG. 1, the first phase change material layers 142a and 142a' and the third phase change material layers 142c and 142c' may include a GeSbTe material, a material in which In is removed from the $In_\alpha Ge_\beta Sb_\gamma Te_\delta$ material of the second phase change material layers 142b and 142b', or may include an InGeSbTe material, a material of which an In content is lower than an In content of the $In_\alpha Ge_\beta Sb_\gamma Te_\delta$ material of the second phase change material layers 142b and 142b'.

According to an embodiment, the first phase change material layers 142a and 142a' and the third phase change material layers 142c and 142c', contacting the electrode patterns, may be formed of a GeSbTe material without In, or may be formed of an InGeSbTe material having a lower In content than the $In_\alpha Ge_\beta Sb_\gamma Te_\delta$ material of the second phase change material layers 142b and 142b', to more stabilize an interface between each of the data storage material patterns 142 and 142' and each of the electrode patterns. Therefore, reliability of the semiconductor device 100 may be improved.

In an embodiment, the second phase change material layers 142b and 142b' may be referred to as $In_\alpha Ge_\beta Sb_\gamma Te_\delta$ phase change material layers, and the first phase change material layers 142a and 142a' and the third phase change material layer 142c and 142c' may be referred to as a first additional phase change material layer and a second additional phase change material layer, respectively. In the following, even when there is no separate description, a GeSbTe material layer without In or an InGeSbTe material layer having a lower In content than the $In_\alpha Ge_\beta Sb_\gamma Te_\delta$ material layer of the second phase change material layer 142b and 142b' may be referred to as an additional phase change material layer.

As described above, each of the first and second data storage material patterns 142 and 142' may include a plurality of phase change material layers. Various examples of the plurality of phase change material layers will be described with reference to FIGS. 6A to 6I, respectively. FIGS. 6A to 6I are partially enlarged cross-sectional views illustrating modified examples of the first data storage material pattern 142 of FIG. 5. Hereinafter, a description will be made focusing on modified examples of the first data storage material pattern 142.

Figure 6A:
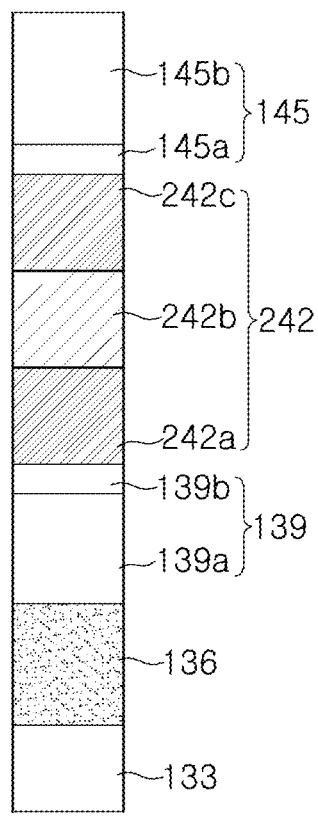
FIGS. 6A to 6I are partially enlarged cross-sectional views illustrating various modified examples of a memory cell structure of a semiconductor device according to an embodiment of inventive concepts.

In a modified example, referring to FIG. 6A, a data storage material pattern 242 may include a first phase change material layer 242a, a second phase change material layer 242b, and a third phase change material layer 242c, sequentially stacked. The first to third phase change material layers 242a, 242b, and 242c may have the same thickness.

The second phase change material layer 242b may be the same material layer as the second phase change material layer of FIGS. 4 and 5 (142b of FIGS. 4 and 5), and the first and third phase change material layers 242a and 242c may be the same material layer as the first and third phase change material layers 142a and 142c of FIGS. 4 and 5, respectively.

Figure 6B:
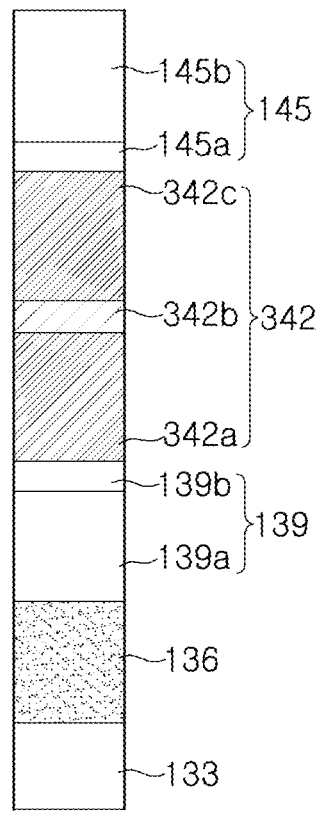

In a modified example, referring to FIG. 6B, a data storage material pattern 342 may include a first phase change material layer 342a, a second phase change material layer 342b, and a third phase change material layer 342c, sequentially stacked. Each of the first and third phase change material layers 342a and 342c may have a thickness greater than a thickness of the second phase change material layer 342b.

The second phase change material layer 342b may be the same material layer as the second phase change material layer of FIGS. 4 and 5 (142b of FIGS. 4 and 5), and the first and third phase change material layers 342a and 342c may be the same material layer as the first and third phase change material layers 142a and 142c of FIGS. 4 and 5, respectively.

Figure 6C:
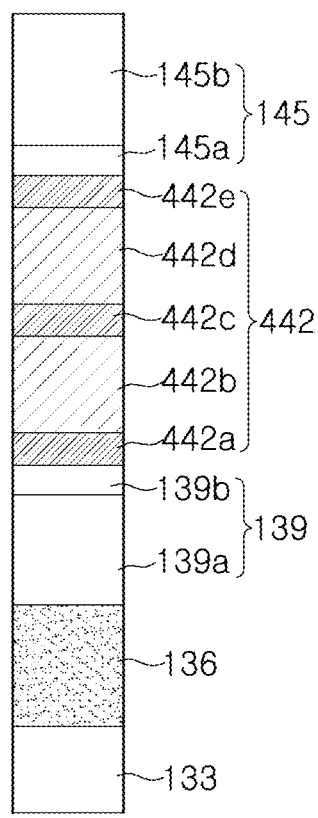

In a modified example, referring to FIG. 6C, a data storage material pattern 442 may include a first phase change material layer 442a, a second phase change material layer 442b, a third phase change material layer 442c, a fourth phase change material layer 442d, and a fifth phase change material layer 442e, sequentially stacked.

The first, third, and fifth phase change material layers 442a, 442c, and 442e may have the same thickness, and the second and fourth phase change material layers 442b and 442d have the same thickness. The thickness of each of the first, third, and fifth phase change material layers 442a, 442c, and 442e may be lower than the thickness of each of the second and fourth phase change material layers 442b and 442d.

The second and fourth phase change material layers 442b and 442d may include the same material as the $In_\alpha Ge_\beta Sb_\gamma Te_\delta$ material of the data storage material pattern (42 in FIG. 1) illustrated in FIG. 1, and the first, third, and fifth phase change material layers 442a, 442c, and 442e may include a GeSbTe material without In, or may include an InGeSbTe material having a lower In content than the $In_\alpha Ge_\beta Sb_\gamma Te_\delta$ material of the data storage material pattern (42 in FIG. 1).

Figure 6D:
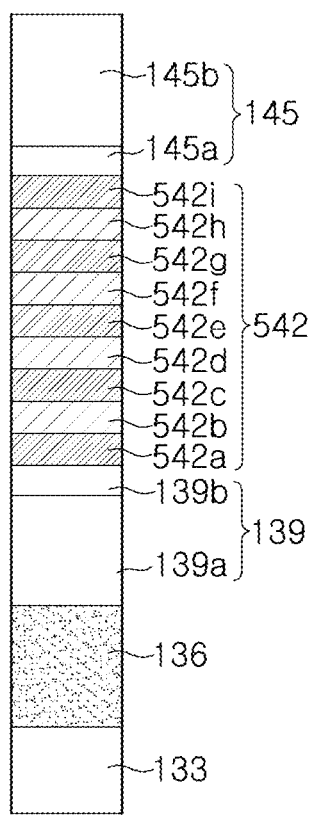

In a modified example, referring to FIG. 6D, a data storage material pattern 542 may include first phase change material layers 542a, 524c, 542e, 542g, and 542i and second phase change material layers 542b, 542d, 542f, and 542h, alternately and repeatedly stacked.

Among the first phase change material layers 542a, 524c, 542e, 542g, and 542i and the second phase change material layers 542b, 542d, 542f, and 542h, an uppermost phase change material layer may be an uppermost first phase change material layer 542i, and a lowermost phase change material layer may be a lowermost first phase change material layer 542a. The first phase change material layers 542a, 524c, 542e, 542g, and 542i may have the same thickness. The second phase change material layers 542b, 542d, 542f, and 542h may have the same thickness. The first phase change material layers 542a, 524c, 542e, 542g, and 542i and the second phase change material layers 542b, 542d, 542f, and 542h may have the same thickness.

The second phase change material layers 542b, 542d, 542f, and 542h may be formed of the same material as the $In_\alpha Ge_\beta Sb_\gamma Te_\delta$ material of the data storage material pattern (42 in FIG. 1) illustrated in FIG. 1, and the first phase change material layers 542a, 524c, 542e, 542g, and 542i may include a GeSbTe material without In, or may include an InGeSbTe material having a lower In content than the $In_\alpha Ge_\beta Sb_\gamma Te_\delta$ material of the data storage material pattern (42 in FIG. 1).

Figure 6E:
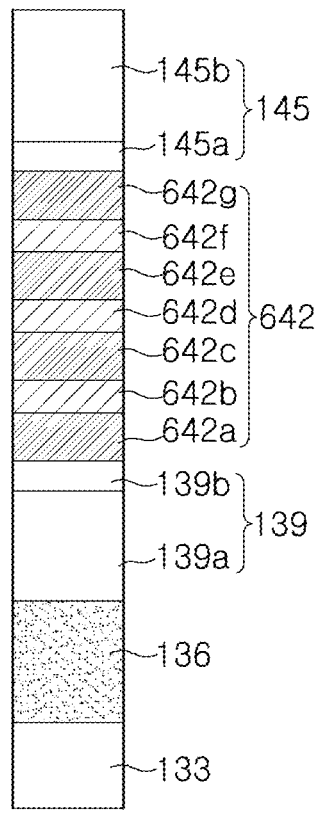

In a modified example, referring to FIG. 6E, a data storage material pattern 642 may include first phase change material layers 642a, 642c, 642e, and 642g and second phase change material layers 642b, 642d, and 642f, alternately and repeatedly stacked. Among the first phase change material layers 642a, 644c, 642e, and 642g and the second phase change material layers 642b, 642d, and 642f, an uppermost phase change material layer may be an uppermost first phase change material layer 642g, and a lowermost phase change material layer may be a lowermost first phase change material layer 642a. A thickness of each of the first phase change material layers 642a, 642c, 642e, and 642g may be greater than a thickness of each of the second phase change material layers 642b, 642d, and 642f.

The second phase change material layers 642b, 642d, and 642f may be formed of the same material as the $In_\alpha Ge_\beta Sb_\gamma Te_\delta$ material of the data storage material pattern (42 in FIG. 1) illustrated in FIG. 1, and the first phase change material layers 642a, 642c, 642e, and 642g may include a GeSbTe material without In, or may include an InGeSbTe material having a lower In content than the $In_\alpha Ge_\beta Sb_\gamma Te_\delta$ material of the data storage material pattern (42 in FIG. 1).

Figure 6F:
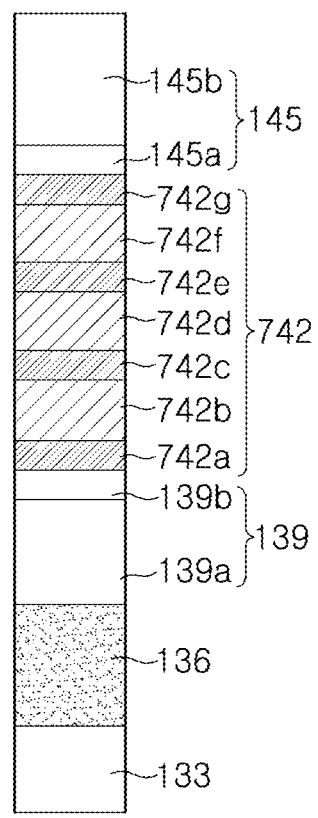

In a modified example, referring to FIG. 6F, the data storage material pattern 742 may include first phase change material layers 742a, 742c, 742e, and 742g and second phase change material layers 742b, 742d, and 742f, alternately and repeatedly stacked. Among the first phase change material layers 742a, 742c, 742e, and 742g and the second phase change material layers 742b, 742d, and 742f, an uppermost phase change material layer may be an uppermost first phase change material layer 742g, and a lowermost phase change material layer may be a lowermost first phase change material layer 742a. A thickness of each of the first phase change material layers 742a, 742c, 742e, and 742g may be less than a thickness of each of the second phase change material layers 742b, 742d, and 742f.

The second phase change material layers 742b, 742d, and 742f may be formed of the same material as the $In_\alpha Ge_\beta Sb_\gamma Te_\delta$ material of the data storage material pattern (42 in FIG. 1) illustrated in FIG. 1, and the first phase change material layers 742a, 742c, 742e, and 742g may include a GeSbTe material without In, or may include an InGeSbTe material having a lower In content than the $In_\alpha Ge_\beta Sb_\gamma Te_\delta$ material of the data storage material pattern (42 in FIG. 1).

Figure 6G:
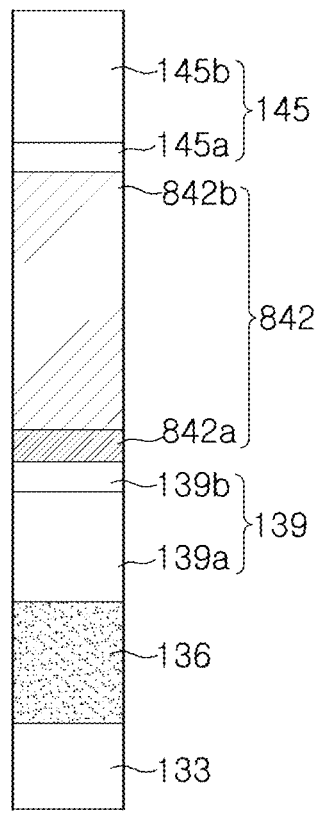

In a modified example, referring to FIG. 6G, a data storage material pattern 842 may include a first phase change material layer 842a, and a second phase change material layer 842b disposed on the first phase change material layer 842a and thicker than the first phase change material layer 842a.

The second phase change material layer 842b may be formed of the same material as the $In_\alpha Ge_\beta Sb_\gamma Te_\delta$ material of the data storage material pattern (42 in FIG. 1) illustrated in FIG. 1, and the first phase change material layer 842a may include a GeSbTe material without In, or may include an InGeSbTe material having a lower In content than the $In_\alpha Ge_\beta Sb_\gamma Te_\delta$ material of the data storage material pattern (42 in FIG. 1).

Figure 6H:
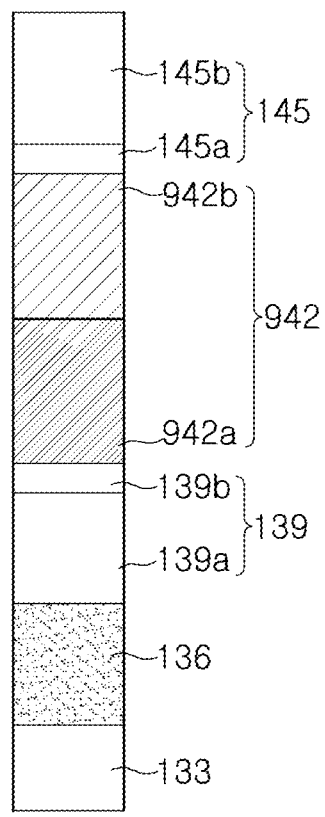

In a modified example, referring to FIG. 6H, a data storage material pattern 942 may include a first phase change material layer 942a, and a second phase change material layer 942b disposed on the first phase change material layer 942a and having the same thickness as the first phase change material layer 942a.

The second phase change material layer 942b may be formed of the same material as the $In_\alpha Ge_\beta Sb_\gamma Te_\delta$ material of the data storage material pattern (42 in FIG. 1) illustrated in FIG. 1, and the first phase change material layer 942a may include a GeSbTe material without In, or may include an InGeSbTe material having a lower In content than the $In_\alpha Ge_\beta Sb_\gamma Te_\delta$ material of the data storage material pattern (42 in FIG. 1).

Figure 6I:
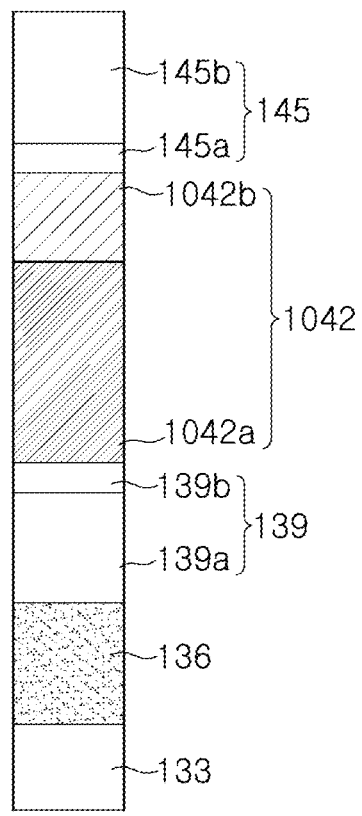

In a modified example, referring to FIG. 6I, a data storage material pattern 1042 may include a first phase change material layer 1042a, and a second phase change material layer 1042b disposed on the first phase change material layer 1042a and thinner than the first phase change material layer 1042a.

The second phase change material layer 1042b may be formed of the same material as the $In_\alpha Ge_\beta Sb_\gamma Te_\delta$ material of the data storage material pattern (42 in FIG. 1) illustrated in FIG. 1, and the first phase change material layer 1042a may include a GeSbTe material without In, or may include an InGeSbTe material having a lower In content than the $In_\alpha Ge_\beta Sb_\gamma Te_\delta$ material of the data storage material pattern (42 in FIG. 1).

Next, various shapes of a data storage material pattern of a memory cell structure of a semiconductor device according to an embodiment of inventive concepts will be described with reference to FIGS. 7A to 7E, respectively. Each of FIGS. 7A to 7E is a view illustrating a cross-sectional structure of any one of data storage material patterns.

Figure 7A:
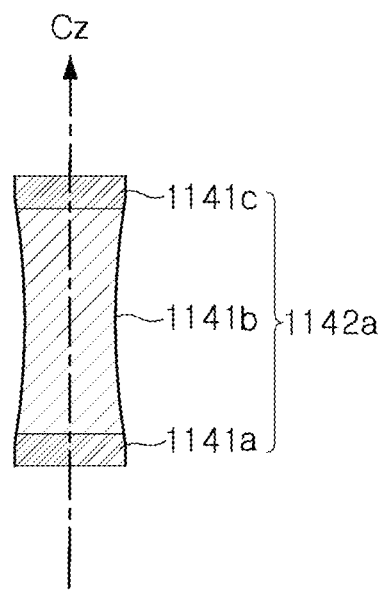
FIGS. 7A to 7E are partially enlarged cross-sectional views illustrating various modified examples of a memory cell structure of a semiconductor device according to an embodiment of inventive concepts.

Referring to FIG. 7A, a data storage material pattern 1142*a*, among the data storage material patterns described above with reference to FIGS. 1 to 6I, may have a concave lateral surface in a direction directing a vertical central axis Cz of the data storage material pattern 1142*a*. For example, the data storage material pattern 1142*a* including first to third phase change material layers 1141*a*, 1141*b*, and 1141*c* respectively corresponding to the first to third phase change material layers 142*a*, 142*b*, and 142*c* of the data storage material pattern 142, as illustrated in FIG. 5, may have a concave lateral surface in a central portion in a direction directing the vertical central axis Cz of the data storage material pattern 1142*a*.

In an embodiment, the vertical central axis Cz of the data storage material pattern 1142*a* may refer to an axis in a vertical direction, passing through a center between both lateral surfaces of the data storage material pattern 1142*a*.

Figure 7B:
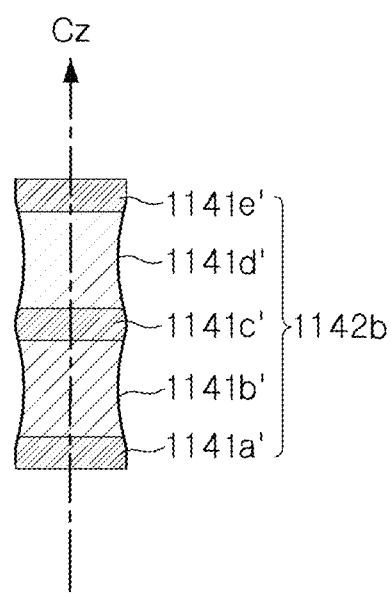

In another example, referring to FIG. 7B, in a data storage material pattern 1142*b* including first to fifth phase change material layers 1141*a'*, 1141*b'*, 1141*c'*, 1141*d'*, and 1141*e'* stacked in a sequence corresponding to the first to fifth phase change material layers 442*a*, 442*b*, 442*c*, 442*d*, and 442*e*, sequentially stacked, of the data storage material pattern 442 as in FIG. 6C, each of the second and fourth phase change material layers 1441*b'* and 1441*d'* may have a concave lateral surface, as compared to the first, third, and fifth phase change material layers 1441*a'*, 1441*c'*, and 1441*e'*, in a direction directing a vertical central axis Cz of the data storage material pattern 1142*b*. Therefore, a central portion of the data storage material pattern 1142*b* may have a relatively convex lateral surface, and lower and upper portions of the data storage material pattern 1142*b* may have a relatively concave lateral surface.

Figure 7C:
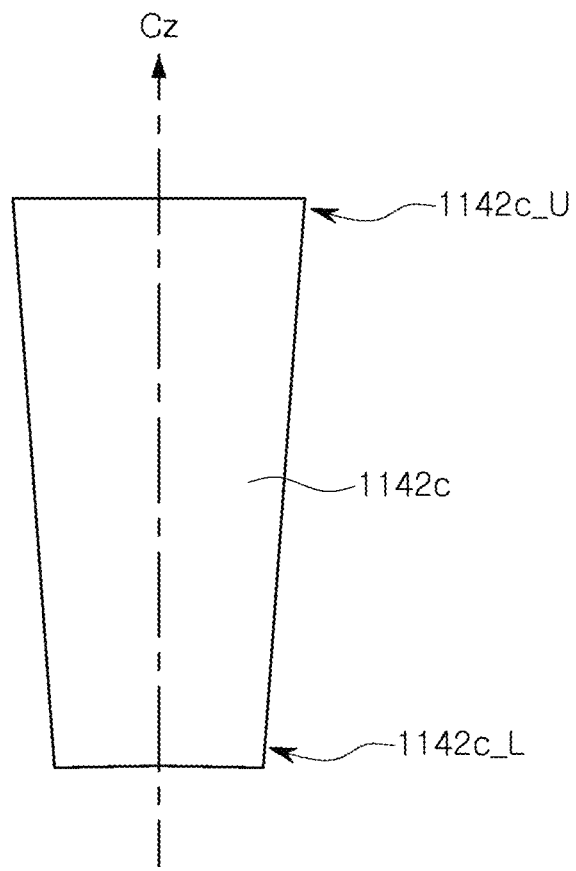

In another example, referring to FIG. 7C, at least a portion of a data storage material pattern 1142*c*, among the data storage material patterns described above with reference to FIGS. 1 to 6I, may have a lateral surface of a negative slope. For example, a width of an upper portion of the data storage material pattern 1142*c* may be wider than a width of a lower portion of the data storage material pattern 1142*c*, and a width may gradually decrease from an upper region 1142*c*_U to a lower region 1142*c*L.

Figure 7D:
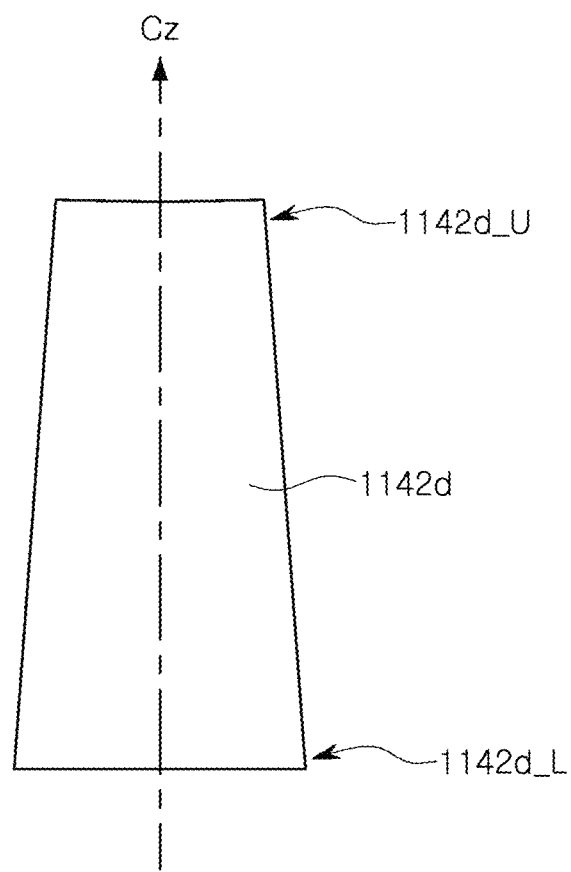

In another example, referring to FIG. 7D, at least a portion of a data storage material pattern 1142*d*, among the data storage material patterns described above with reference to FIGS. 1 to 6I, may have a lateral surface of a positive slope. For example, a width of an upper portion of the data storage material pattern 1142*d* may be narrower than a width of a lower portion of the data storage material pattern 1142*d*, and a width may gradually increase from an upper region 1142*d*_U to a lower region 1142*d*_L.

Figure 7E:
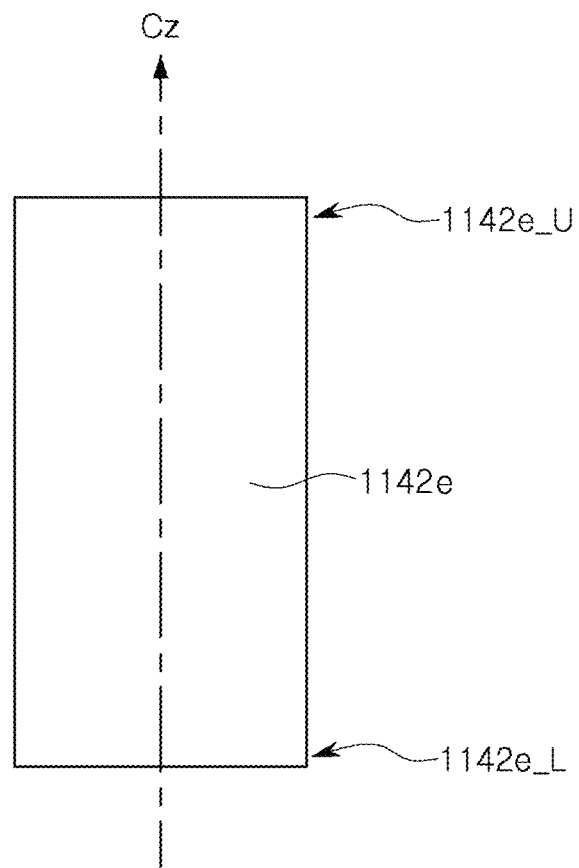

In another example, referring to FIG. 7E, at least a portion of a data storage material pattern 1142*e*, among the data storage material patterns described above with reference to FIGS. 1 to 6I, may have a lateral surface having a substantially vertical slope. For example, widths of upper and lower portions of the data storage material pattern 1142*e* may be substantially the same, and a width may be substantially the same from an upper region 1142*e*_U to a lower region 1142*e*_L.

Next, various modified examples of the semiconductor device according to the embodiment will be described with reference to FIGS. 8A and 8B, respectively. Each of FIGS. 8A and 8B is a schematic cross-sectional view of FIG. 3, taken along lines I-I' and II-II'.

Figure 8A:
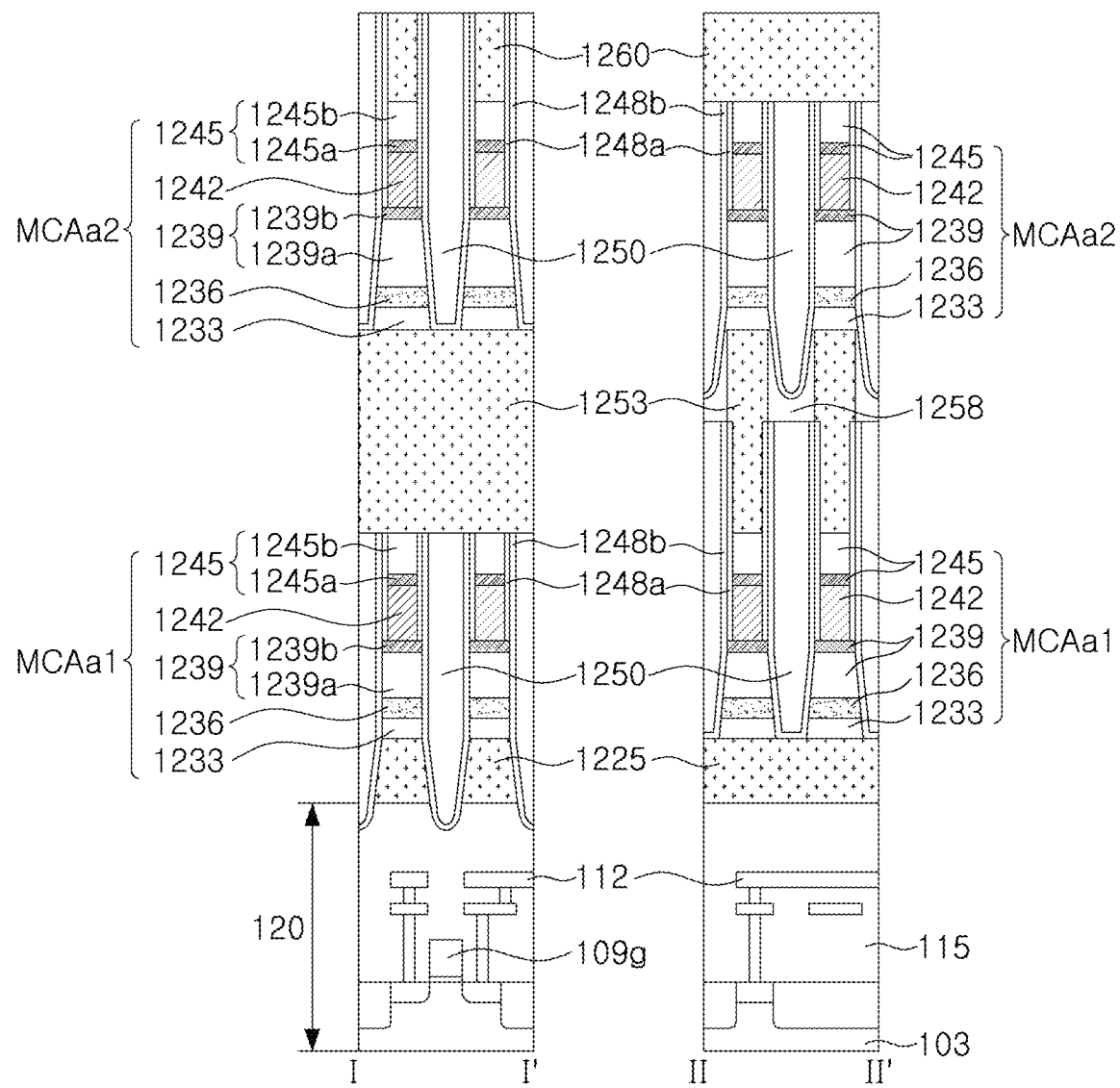
FIGS. 8A and 8B are partial cross-sectional views illustrating various modified examples of a semiconductor device according to an embodiment of inventive concepts.
Figure 8B:
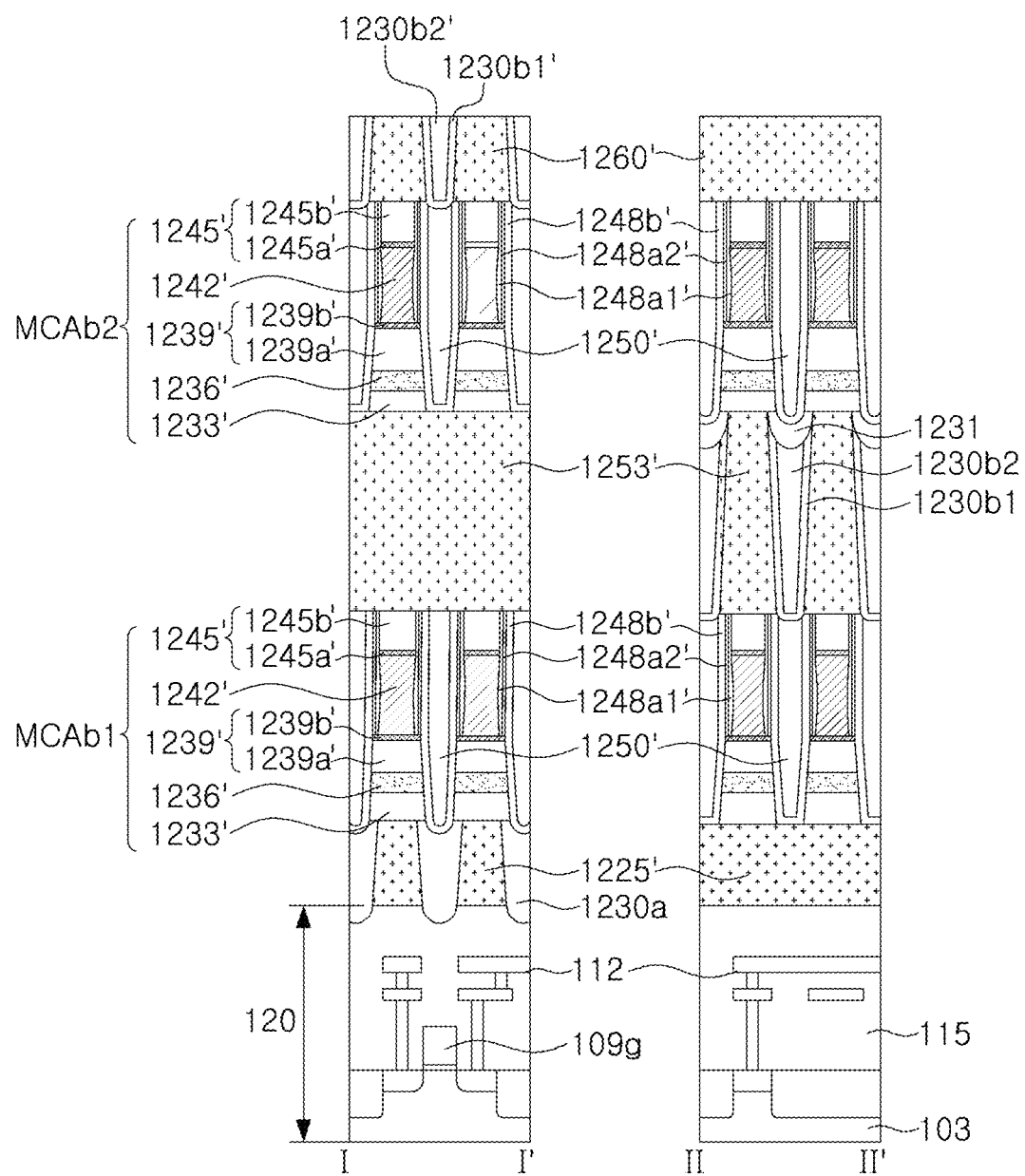

In an example, referring to FIG. 8A, first conductive lines 1225 extending in the first horizontal direction X may be disposed on a lower structure (120 in FIG. 4), as illustrated in FIG. 4. Second conductive lines 1253 extending in the second horizontal direction Y, perpendicular to the first horizontal direction X, may be disposed on the first conductive lines 1225. Third conductive lines 1260 extending in the first horizontal direction X may be disposed on the second conductive lines 1253.

Lower memory cell structures MCAa1 may be disposed between the first conductive lines 1225 and the second conductive lines 1253, and upper memory cell structures MCAa2 may be disposed between the second conductive lines 1253 and the third conductive lines 1260. Each of the lower and upper memory cell structures MCAa1 and MCAa2 may include a lower electrode pattern 1233, a selector material pattern 1236, an intermediate electrode pattern 1239, a data storage material pattern 1242, and an upper electrode pattern 1245, sequentially stacked in the vertical direction Z.

The data storage material pattern 1242 may be any one of the data storage material patterns described above with reference to FIGS. 1 to 6I.

A material of the lower electrode pattern 1233, a material of the selector material pattern 1236, a material of the intermediate electrode pattern 1239, a material of the data storage material pattern 1242, and a material of the upper electrode pattern 1245 may correspond to the material of the lower electrode pattern 33, the material of the selector material pattern 36, the material of the intermediate electrode pattern 39, the material of the data storage material pattern 42, and the material of the upper electrode pattern 45, illustrated in FIG. 1, respectively.

The intermediate electrode pattern 1239 may include a first intermediate electrode layer 1239*a* and a second intermediate electrode layer 1239*b*, sequentially stacked. The first intermediate electrode layer 1239*a* and the second intermediate electrode layer 1239*b* may respectively correspond to the first intermediate electrode layer 39*a* and the second intermediate electrode layer 39*b*, sequentially stacked, as illustrated in FIG. 1. The upper electrode pattern 1245 may include a first upper electrode layer 1245*a* and a second upper electrode layer 1245*b*, sequentially stacked. The first upper electrode layer 1245*a* and the second upper electrode layer 1245*b* may respectively correspond to the first upper electrode layer 45*a* and the second upper electrode layer 45*b*, illustrated in FIG. 1. In an example, a structure in which the lower electrode pattern 1233, the selector material pattern 1236, and the intermediate electrode pattern 1239 are sequentially stacked may have an inclined lateral surface. For example, in the cross-sectional structure cut in a length direction of the first conductive lines 1225, the structure having the lower electrode pattern 1233, the selector material pattern 1236, and the intermediate electrode pattern 1239 may have an inclined lateral surface.

In an example, at least one of the first conductive lines 1225 may have an inclined lateral surface. In any one of the first conductive lines 1225, a width of a lower surface thereof may be wider than a width of an upper surface thereof. In another example, at least one of the first conductive lines 1225 may have a partially concave lateral surface.

In an example, the data storage material pattern 1242 in FIG. 8A may have substantially the same cross-sectional shape as the data storage material pattern in FIG. 7E, but embodiments of inventive concepts are not limited thereto. For example, the data storage material pattern 1242 in FIG. 8A may have substantially the same cross-sectional shape as one of the data storage material patterns described with reference to FIGS. 7A to 7D.

The second conductive lines 1253 may include a metal nitride layer such as TiN or the like, and a metal layer such as W or the like.

In an example, lower surfaces of the second conductive lines 1253 in a portion overlapping the lower memory cell structures MCAa1 may be lower than lower surfaces of the second conductive lines 1253 in a portion not overlapping the memory cell structures lower MCAa1.

An insulating spacer 1248*a* covering a lateral surface of the data storage material pattern 1242 and a lateral surface of the upper electrode pattern 1245 in each of the lower and upper memory cell structures MCAa1 and MCAa2 may be disposed.

A capping insulating layer 1248*b* having a "U"-shape may be disposed to cover lateral surfaces of each of the lower and upper memory cell structures MCAa1 and MCAa2. The capping insulating layer 1248*b* may cover an outer lateral surface of the insulating spacer 1248*a*.

The capping insulating layer 1248*b* covering the lateral surfaces of each of the lower memory cell structures MCAa1 may cover lateral surfaces of the first conductive lines 1225, and may extend into the lower structure 120. Therefore, a lowermost end of the capping insulating layer 1248*b* covering the lateral surfaces of each of the lower memory cell structures MCAa1 may be disposed on a lower level than lower surfaces of the first conductive lines 1225.

The capping insulating layer 1248*b* covering the lateral surfaces of each of the upper memory cell structures MCAa2 may extend into the second conductive lines 1253. Therefore, a lowermost end of the capping insulating layer 1248*b* covering the lateral surfaces of each of the upper memory cell structures MCAa2 may be disposed on a lower level than upper surfaces of the second conductive lines 1253.

At least one of the insulating spacer 1248*a* and the capping insulating layers 1248*a* may include at least one of SiN, SiO$_2$, SiON, SiBN, SiCN, SiOCN, Al$_2$O$_3$, AlN, or AlON. For example, the insulating spacer 1248*a* may include a silicon oxide or a silicon oxide-based insulating material, and the capping insulating layer 1248*b* may include a silicon nitride or a silicon nitride-based insulating material.

Gap-fill insulating patterns 1250 disposed on the capping insulating layer 1248*b* covering the lateral surfaces of each of the lower memory cell structures MCAa1 and filling between the lower memory cell structures MCAa1, and gap-fill insulating patterns 1250 disposed on the capping insulating layer 1248*b* covering the lateral surfaces of each of the upper memory cell structures MCAa2 and filling between the upper memory cell structures MCAa2 may be disposed.

The gap-fill insulating patterns 1250 may include at least one of SiN, SiON, SiC, SiCN, SiOC, SiOCN, SiO$_2$, or Al$_2$O$_3$.

In an example, the insulating spacers 1248*a*, the capping insulating layer 1248*b*, and the gap-fill insulating patterns 1250, arranged on the lateral surfaces of the lower memory cells MCAa1, may extend between the second conductive lines 1253.

Between the second conductive lines 1253, a barrier insulating layer 1258 may be disposed on upper surfaces of the insulating spacers 1248*a*, an upper surface of the capping insulating layer 1248*b*, and upper surfaces of the gap-fill insulating patterns 1250, arranged on the lateral surfaces of the lower memory cells MCAa1. The barrier insulating layer 1258 may be formed of an insulating material such as silicon oxide, silicon nitride, or the like.

In an example, the insulating spacers 1248*a*, the capping insulating layer 1248*b*, and the gap-fill insulating patterns 1250, arranged on the lateral surfaces of the upper memory cells MCAa2, may extend between the third conductive lines 1260.

In another example, referring to FIG. 8B, first conductive lines 1225' extending in the first horizontal direction X may be disposed on a lower structure (120 in FIG. 4), as illustrated in FIG. 4. Second conductive lines 1253' extending in the second horizontal direction Y, perpendicular to the first horizontal direction X, may be disposed on the first conductive lines 1225'. Third conductive lines 1260' extending in the first horizontal direction X may be disposed on the second conductive lines 1253'.

Lower memory cell structures MCAb1 may be disposed between the first conductive lines 1225' and the second conductive lines 1253', and upper memory cell structures MCAb2 may be disposed between the second conductive lines 1253' and the third conductive lines 1260'. Each of the lower and upper memory cell structures MCAb1 and MCAb2 may include a lower electrode pattern 1233', a selector material pattern 1236', an intermediate electrode pattern 1239', a data storage material pattern 1242', and an upper electrode pattern 1245', sequentially stacked in the vertical direction Z.

The data storage material pattern 1242' may be any one of the data storage material patterns described above with reference to FIGS. 1 to 6I.

In an example, a material of the lower electrode pattern 1233', a material of the selector material pattern 1236', a material of the intermediate electrode pattern 1239', a material of the data storage material pattern 1242', and a material of the upper electrode pattern 1245' may correspond to the material of the lower electrode pattern 33, the material of the selector material pattern 36, the material of the intermediate electrode pattern 39, the material of the data storage material pattern 42, and the material of the upper electrode pattern 45, illustrated in FIG. 1, respectively. The intermediate electrode pattern 1239' may include a first intermediate electrode layer 1239*a'* and a second intermediate electrode layer 1239*b'*, sequentially stacked. The first intermediate electrode layer 1239*a'* and the second intermediate electrode layer 1239*b'* may respectively correspond to the first intermediate electrode layer 39*a* and the second intermediate electrode layer 39*b*, sequentially stacked, as illustrated in FIG. 1. The upper electrode pattern 1245' may include a first upper electrode layer 1245*a'* and a second upper electrode layer 1245*b'*, sequentially stacked. The first upper electrode layer 1245*a'* and the second upper electrode layer 1245*b'* may respectively correspond to the first upper electrode layer 45*a* and the second upper electrode layer 45*b*, illustrated in FIG. 1.

At least one of the first conductive lines 1225' may have an inclined lateral surface. In at least one of the first conductive lines 1225', a width of an upper surface thereof may be wider than a width of a lower surface thereof.

In an example, a structure in which the lower electrode pattern 1233', the selector material pattern 1236', and the first intermediate electrode layer 1239a' are sequentially stacked may have an inclined lateral surface. A width of a lower surface of the lower electrode pattern 1233' may be wider than a width of an upper surface of the first intermediate electrode layer 1239a'.

In an example, at least one of the first conductive lines 1225' may have an inclined lateral surface. In any one of the first conductive lines 1225', a width of a lower surface thereof may be wider than a width of an upper surface thereof.

In an example, the data storage material pattern 1242' in FIG. 8B may have substantially the same cross-sectional shape as the data storage material pattern 1042a in FIG. 7A, but embodiments of inventive concepts are not limited thereto. For example, the data storage material pattern 1242' in FIG. 8B may have substantially the same cross-sectional shape as any one of the data storage material patterns described with reference to FIGS. 7B to 7E.

The second conductive lines 1253' include a first conductive layer 1253a', and a second conductive layer 1253b' disposed on the first conductive layer 1253a' and thicker than the first conductive layer 1253a'. For example, the first conductive layer 1253a' may include a metal nitride such as TiN or the like, and the second conductive layer 1253b' may include a metal layer such as W or the like.

Lower gap-fill patterns 1230a filling between the first conductive lines 1225' and extending into the lower structure 120 may be disposed. The lower gap-fill patterns 1230a may be formed of an insulating material such as silicon oxide, a low dielectric material, or the like.

In an example, a void may be formed in each of the lower gap-fill patterns 1230a.

An internal insulating spacer 1248a1' covering a lateral surface of the data storage material pattern 1242' and a lateral surface of the upper electrode pattern 1245', and an external insulating spacer 1248a2' covering an outer lateral surface of the internal insulating spacer 1248a1' may be arranged in each of the lower and upper memory cell structures MCAb1 and MCAb2. A capping insulating layer 1248b' having a "U"-shape may be disposed to cover lateral surfaces of each of the lower and upper memory cell structures MCAb1 and MCAb2. The capping insulating layer 1248b' may cover an outer lateral surface of the external insulating spacer 1248a2'. The capping insulating layer 1248b' may include one or a plurality of layers. The capping insulating layer 1248b', the internal insulating spacer 1248a1', and the external insulating spacer 1248a2' may include at least one of SiN, $SiO_2$, SiON, SiBN, SiCN, SiOCN, $Al_2O_3$, AlN, or AlON. The capping insulating layer 1248b' covering the lateral surfaces of each of the lower memory cell structures MCAb1 may extend between the first conductive lines 1225'. Therefore, a lowermost end of the capping insulating layer 1248b' covering the lateral surfaces of each of the lower memory cell structures MCAb1 may be disposed on a lower level than upper surfaces of the first conductive lines 1225'.

The capping insulating layer 1248b' covering the lateral surfaces of each of the upper memory cell structures MCAb2 may extend between the second conductive lines 1253'. Therefore, a lowermost end of the capping insulating layer 1248b' covering the lateral surfaces of each of the upper memory cell structures MCAb2 may be disposed on a lower level than upper surfaces of the second conductive lines 1253'.

Gap-fill insulating patterns 1250' disposed on the capping insulating layer 1248b' covering the lateral surfaces of each of the lower memory cell structures MCAb1 and filling between the lower memory cell structures MCAb1, and gap-fill insulating patterns 1250' disposed on the capping insulating layer 1248b' covering the lateral surfaces of each of the upper memory cell structures MCAb2 and filling between the upper memory cell structures MCAb2 may be disposed. The gap-fill insulating patterns 1250' may include at least one of SiN, SiON, SiC, SiCN, SiOC, SiOCN, $SiO_2$, or $Al_2O_3$.

In an example, the insulating spacers 1248a1' and 1248a2', the capping insulating layer 1248b', and the gap-fill insulating patterns 1250', arranged on the lateral surfaces of the lower memory cells MCAb1, may extend between the second conductive lines 1253'.

Intermediate gap-fill patterns 1230b1 and 1230b2 may be disposed between the second conductive lines 1253'. The intermediate gap-fill patterns 1230b1 and 1230b2 may include a gap-fill pattern 1230b2, and an insulating liner 1230b1 covering lateral and bottom surfaces of the gap-fill pattern 1230b2. The intermediate gap-fill patterns 1230b1 and 1230b2 may be formed of an insulating material such as silicon oxide, silicon nitride, or the like.

A barrier insulating layer 1231 disposed on the intermediate gap-fill patterns 1230b1 and 1230b2 may be disposed between the second conductive lines 1253'. The barrier insulating layer 1231 may be formed of an insulating material such as silicon oxide, silicon nitride, or the like.

Upper gap-fill patterns 1230b1' and 1230b2' may be disposed between the third conductive lines 1260'. The upper gap-fill patterns 1230b1' and 1230b2' may include a gap-fill pattern 1230b2', and an insulating liner 1230b1' covering lateral and bottom surfaces of the gap-fill pattern 1230b2'. The upper gap-fill patterns 1230b1' and 1230b2' may be formed of an insulating material such as silicon oxide, silicon nitride, or the like. Lowermost ends of the upper gap-fill patterns 1230b1' and 1230b2' may be disposed on a lower level than lower surfaces of the third conductive lines 1260'.

Next, various examples of the memory cell structure MCA illustrated in FIG. 3 will be described with reference to FIGS. 9A to 9C.

Figure 9A:
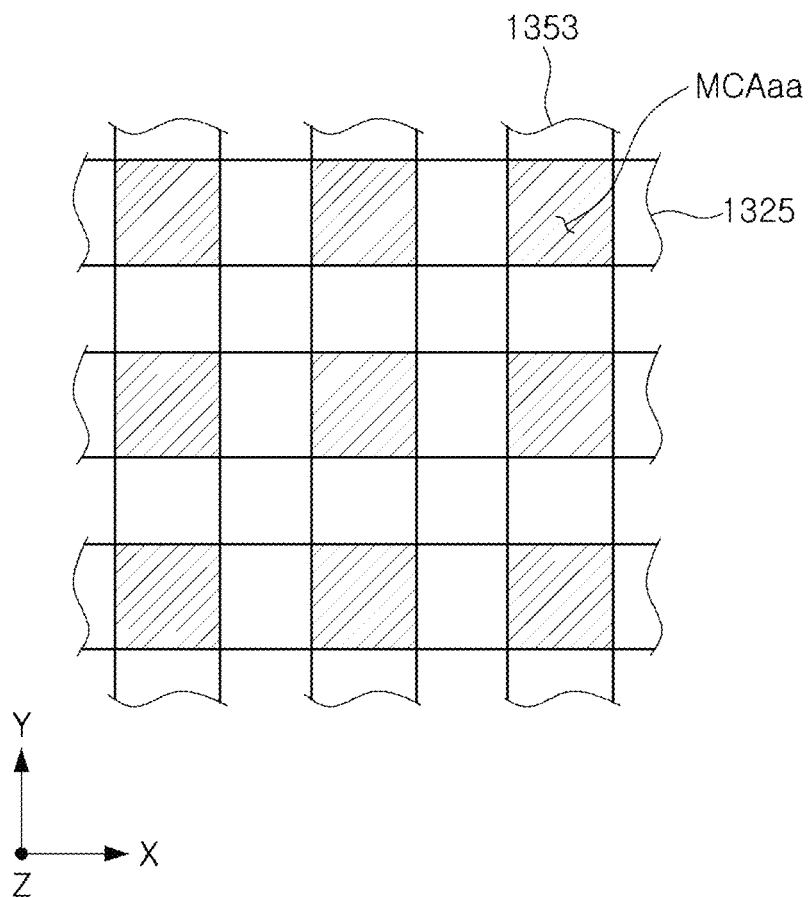
FIGS. 9A to 9C are plan views illustrating various modified examples of a semiconductor device according to an embodiment of inventive concepts.
Figure 9B:
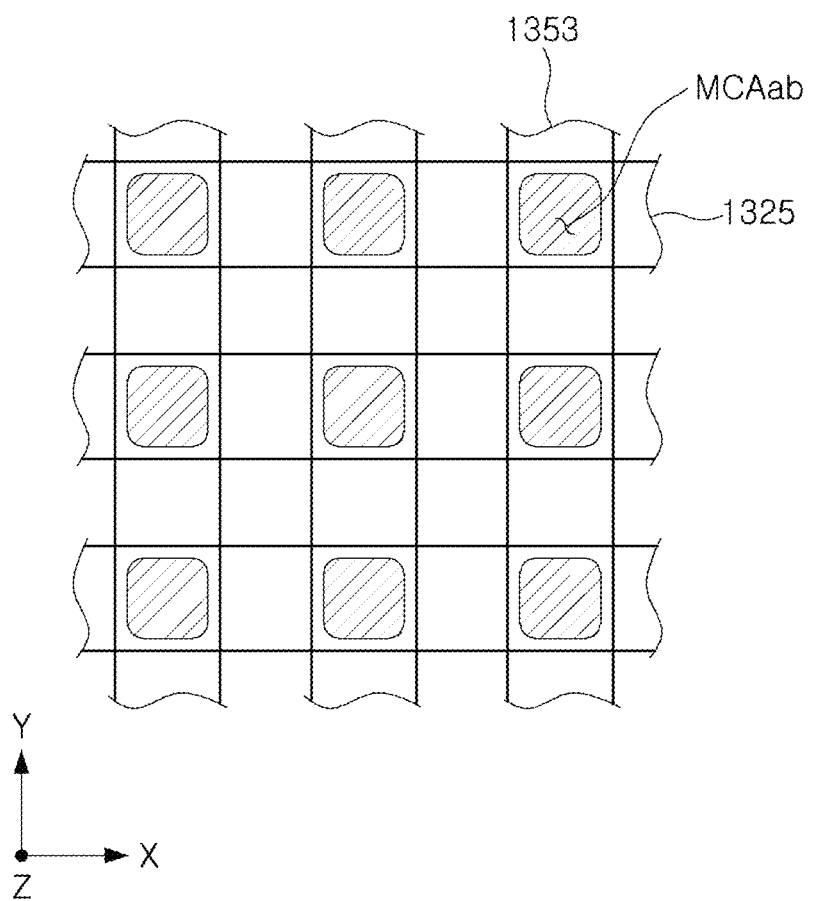
Figure 9C:
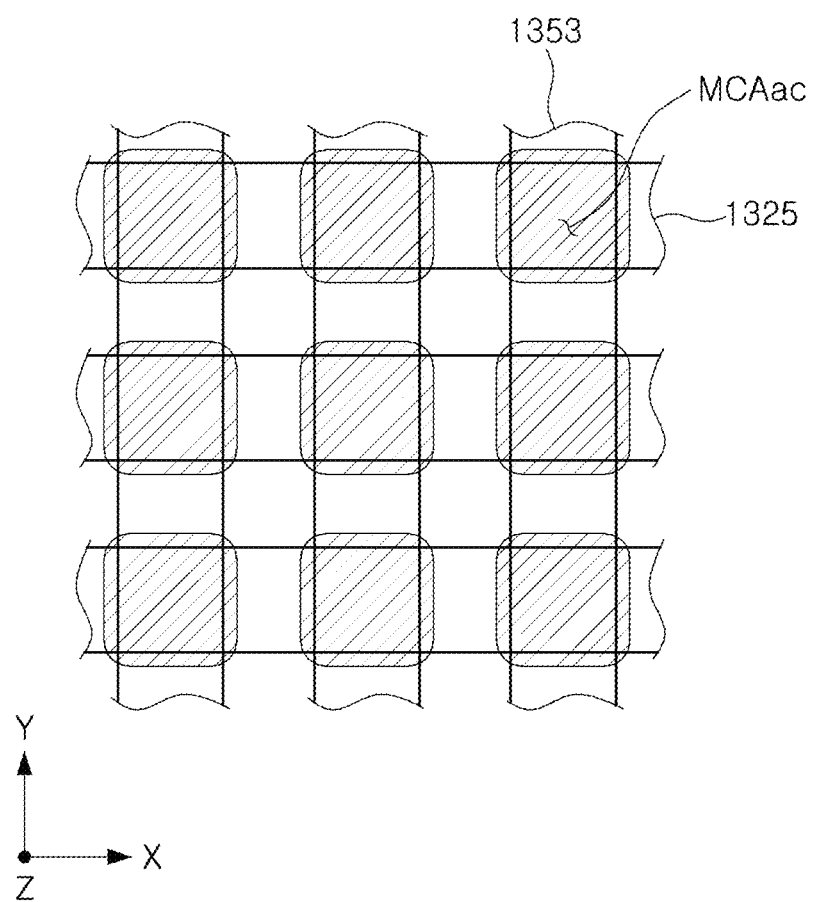

FIGS. 9A to 9C are plan views illustrating lower conductive lines 1325 extending in the first horizontal direction X, upper conductive lines 1353 disposed on a height level higher than the lower conductive lines 1325 and extending in the second horizontal direction Y, perpendicular to the first horizontal direction X, and memory cell structures disposed between the lower and upper conductive lines 1325 and 1353. In FIGS. 9A to 9C, the memory cell structures will be described mainly.

In an example, referring to FIG. 9A, memory cell structures MCAaa may have a rectangular shape, respectively. Each of the memory cell structures MCAaa may have lateral surfaces aligned with both lateral surfaces of the lower conductive lines 1325, and lateral surfaces aligned with both lateral surfaces of the upper conductive lines 1353.

In another example, referring to FIG. 9B, memory cell structures MCAab may have a maximum width of each of the lower conductive lines 1325 in the second horizontal direction Y, narrower than a width of each of the lower conductive lines 1325 in the second horizontal direction Y, and a maximum width of each of the upper conductive lines 1353 in the first horizontal direction X, narrower than a width of each of the upper conductive lines 1353 in the first horizontal direction X, respectively.

In another example, referring to FIG. 9C, memory cell structures MCAac may have a maximum width of each of the lower conductive lines 1325 in the second horizontal direction Y, wider than a width of each of the lower conductive lines 1325 in the second horizontal direction Y, and a maximum width of each of the upper conductive lines 1353 in the first horizontal direction X, wider than a width of each of the upper conductive lines 1353 in the first horizontal direction X, respectively.

Figure 10A:
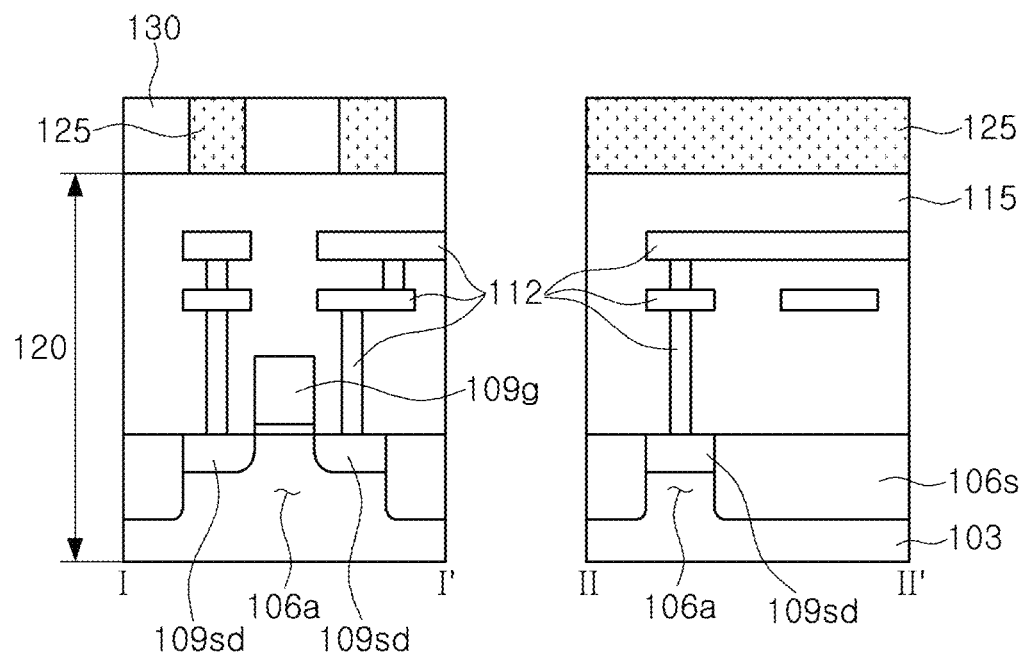
FIGS. 10A to 10C are cross-sectional views illustrating a method of forming a semiconductor device according to an embodiment of inventive concepts.
Figure 10B:
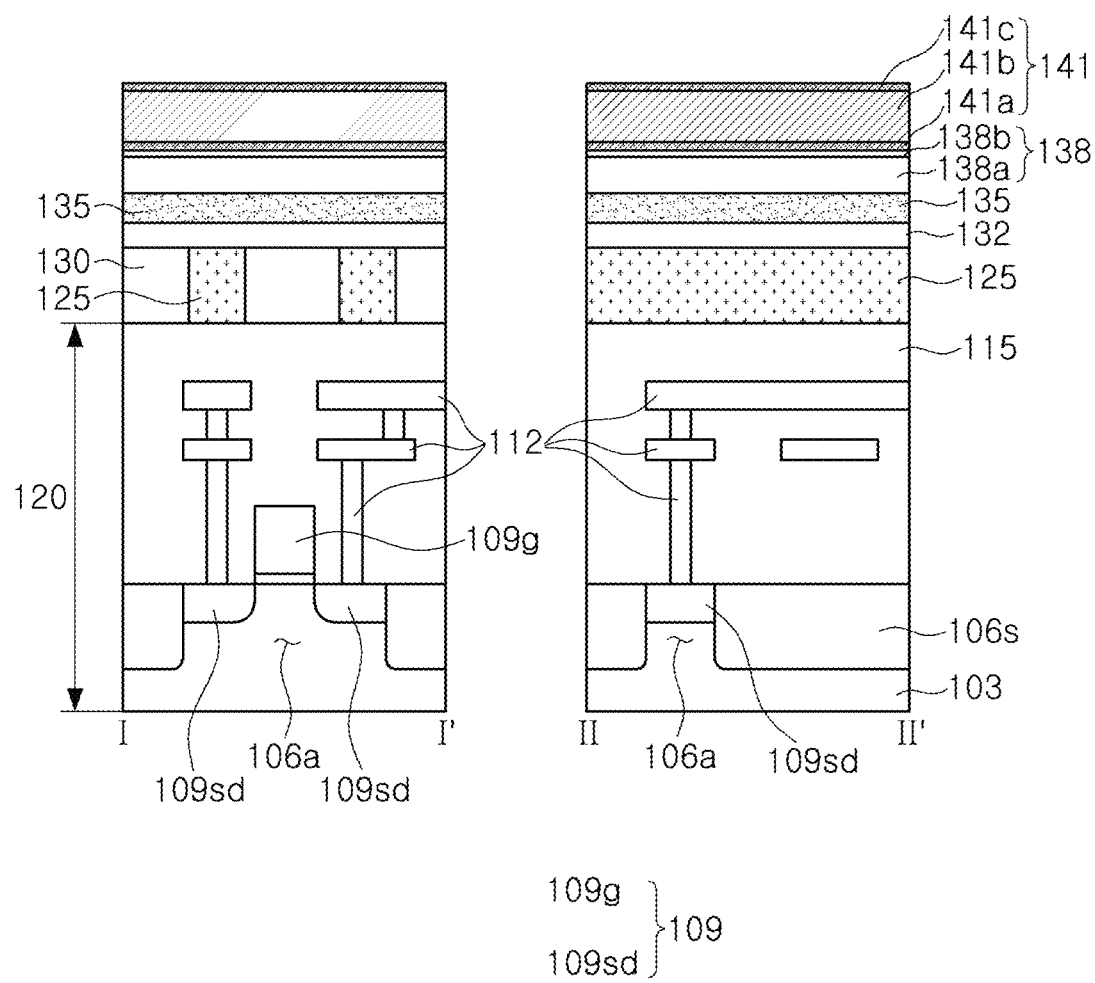
Figure 10C:
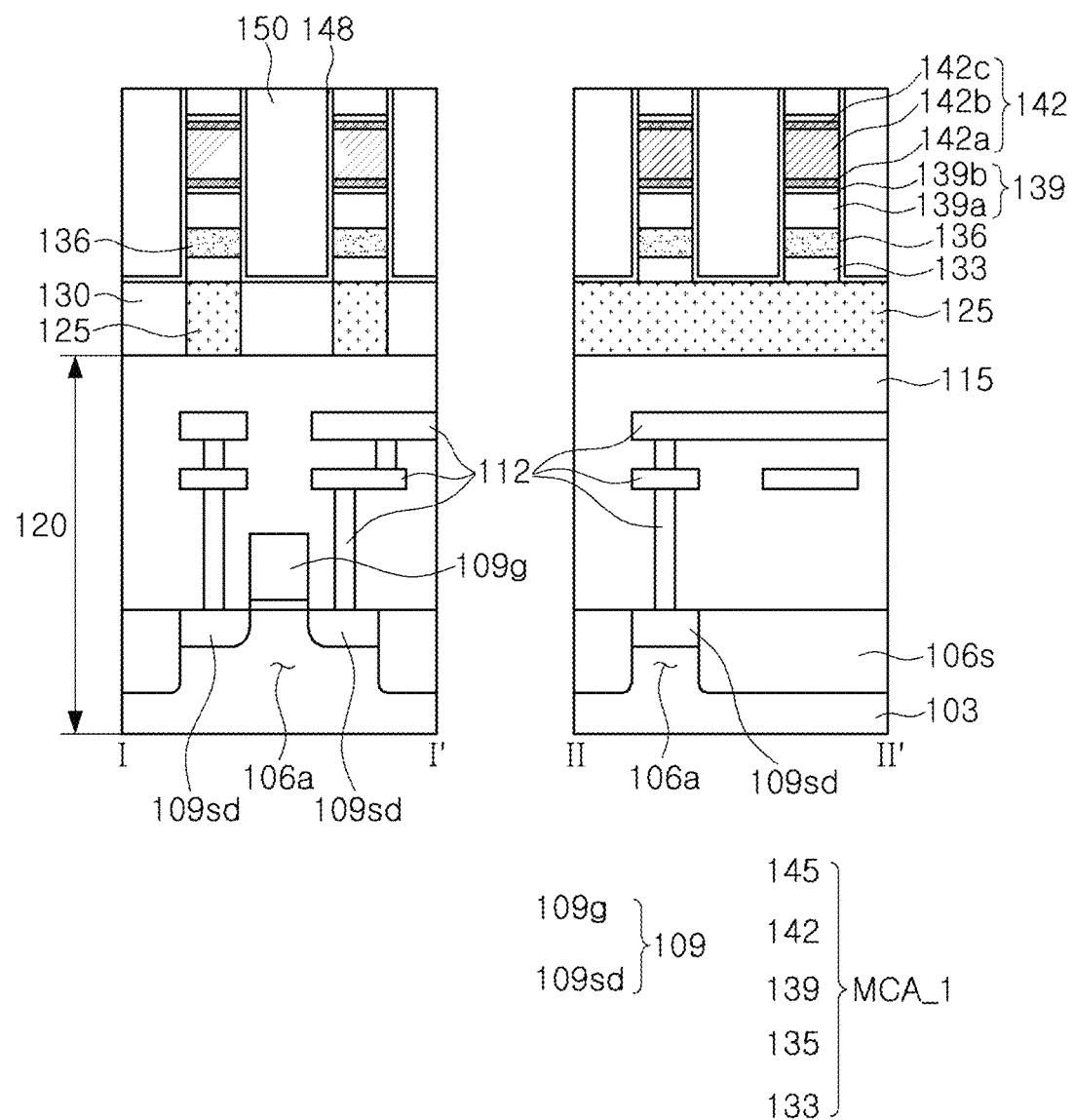

Next, a method of forming a semiconductor device according to an embodiment of inventive concepts will be described with reference to FIGS. 10A to 10C. FIGS. 10A to 10C are cross-sectional views schematically illustrating FIG. 3, taken along lines I-I' and II-II'.

Referring to FIG. 10A, a lower structure 120 may be formed. The formation of the lower structure 120 may include forming a device isolation layer 106s disposed on a semiconductor substrate 103 and defining an active region 106a, forming a circuit device 109 disposed on the active region 106a and including a gate 109g and source/drain regions 109sd, forming a circuit wiring 112 disposed on the circuit device 109, and forming a lower insulating structure 115 covering the circuit wiring 112 and the circuit device 109.

A first conductive line 125 and a first insulating pattern 130 may be formed on the lower structure 120. The first conductive line 125 may include a conductive material such as tungsten or the like. The first insulating pattern 130 may be formed on a lateral surface of the first conductive line 125.

Referring to FIG. 10B, a lower electrode layer 132, a lower selector material layer 135, an intermediate electrode layer 138, and a data storage material layer 141, sequentially stacked on the first conductive line 125 and the first insulating pattern 130, may be formed. The intermediate electrode layer 138 may include a first conductive layer 138a and a second conductive layer 138b, sequentially stacked.

The data storage material layer 141 may be formed as a single phase change material layer or a plurality of phase change material layers. For example, the data storage material layer 141 may include first to third phase change material layers 141a, 141b, and 141c, sequentially stacked.

In an example, when the data storage material layer 141 is a single phase change material layer, the data storage material layer 141 may be formed as a single phase change material layer of the same composition as the $In_\alpha Ge_\beta Sb_\gamma Te_\delta$ material of the data storage material pattern 42, as illustrated in FIG. 1.

In another example, when the data storage material layer 141 includes the first to third phase change material layers 141a, 141b, and 141c, the second phase change material layer 141b may be formed as a phase change material layer having the same composition as the $In_\alpha Ge_\beta Sb_\gamma Te_\delta$ material of the second phase change material layers 142b and 142b', as illustrated in FIGS. 4 and 5, and the first and third phase change material layers 141a and 141c may be formed of a GeSbTe material without In, or may be formed of an InGeSbTe material having a lower In content than the $In_\alpha Ge_\beta Sb_\gamma Te_\delta$ material of the second phase change material layer 141b.

Referring to FIG. 10C, an upper electrode layer may be formed on the data storage material layer 141. The upper electrode layer, the data storage material layer 141, the intermediate electrode layer 138, the selector material layer 135, and the lower electrode layer 132 may be patterned to form a first lower electrode pattern 133, a first lower selector material pattern 136, a first intermediate electrode pattern 139, a first data storage material pattern 142, and a first upper electrode pattern 145, sequentially stacked. The first lower electrode pattern 133, the first lower selector material pattern 136, the first intermediate electrode pattern 139, the first data storage material pattern 142, and the first upper electrode pattern 145, sequentially stacked, may form the first memory cell structure MCA_1 as described with reference to FIGS. 3 to 5. A first capping insulating layer 148 and a first gap-fill insulating pattern 150 surrounding a lateral surface of the first memory cell structure MCA_1 may be formed.

Referring to FIGS. 3 to 5 again, a second conductive line 153 and a second insulating pattern 156 may be formed on the first capping insulating layer 148 and the first gap-fill insulating pattern 150 in the first memory cell structure MCA_1. Subsequently, the second memory cell structure MCA_2 of FIG. 4 may be formed in substantially the same manner as the method of forming the first memory cell structure MCA_1.

Figure 11:
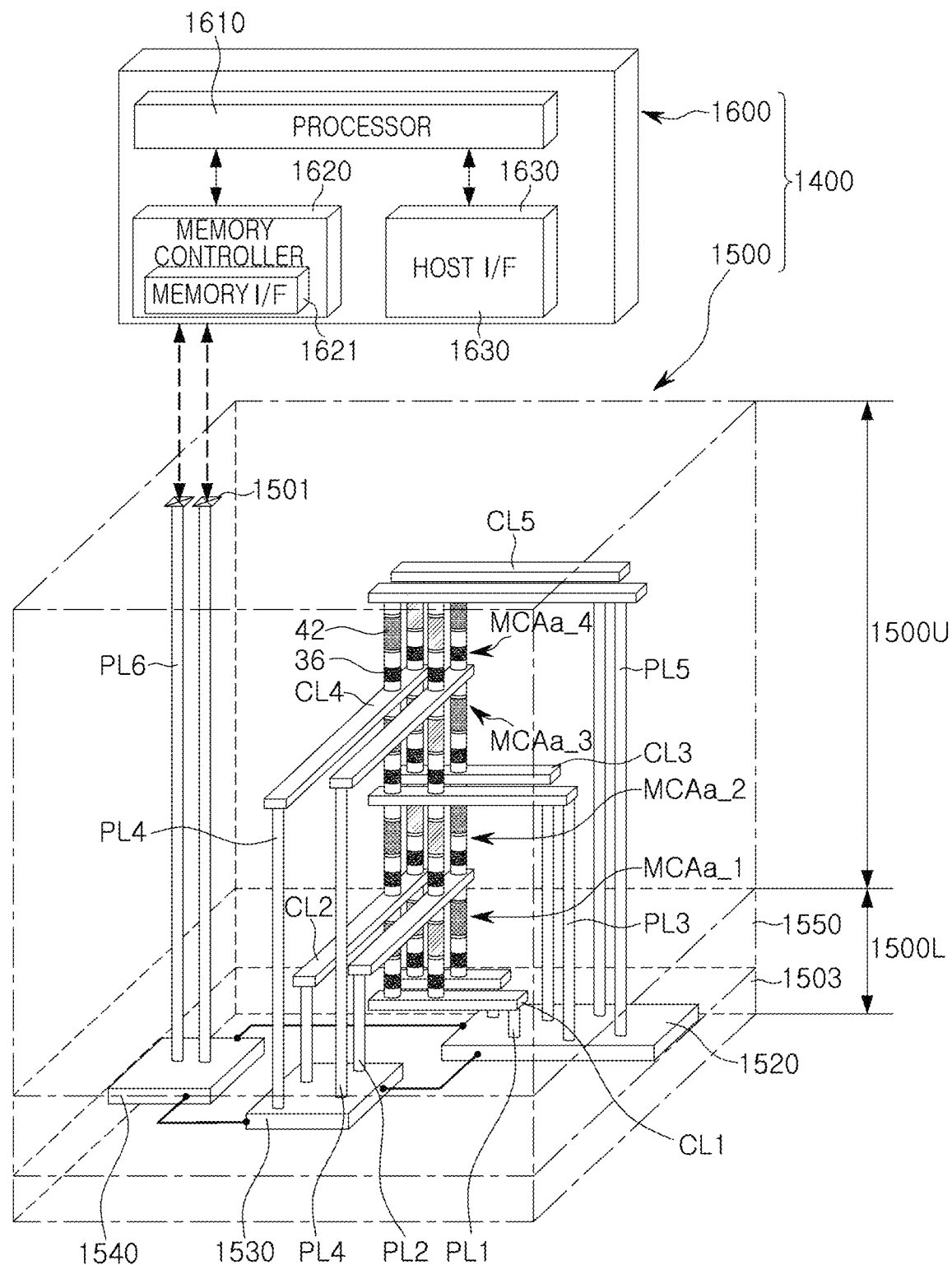
FIG. 11 is a view schematically illustrating an electronic system including a semiconductor device according to an embodiment of inventive concepts.

FIG. 11 is a view schematically illustrating an electronic system including a semiconductor device according to an embodiment of inventive concepts.

Referring to FIG. 11, an electronic system 1400 according to an embodiment of inventive concepts may include a semiconductor device 1500, and a controller 1600 electrically connected to the semiconductor device 1500. The electronic system 1100 may be a storage device including the semiconductor device 1500 or an electronic device including the storage device. For example, the electronic system 1100 may be a solid state drive device (SSD) device, a universal serial bus (USB), a computing system, a medical device, or a communication device, including the semiconductor device 1500.

The semiconductor device 1500 may be a semiconductor device according to any one of the above-described embodiments with reference to FIGS. 1 to 8C. The semiconductor device 1500 may include a first structure 1500L, and a second structure 1500U disposed on the first structure 1500L.

The first structure 1500L may include a row driver 1520, a column driver 1530, and a control logic 1540 electrically connected to the row driver 1520 and the column driver 1530. The row driver 1520 may include an address decoder circuit for selecting data storage material patterns (e.g., 42 of FIG. 1, or 42' of FIG. 2) of a memory cell structure (e.g., MCAa of FIG. 1, or MCAb of FIG. 2) for writing or reading data, and the column driver 1530 may include a read/write circuit for writing data to the data storage material patterns (e.g., 42 of FIG. 1, or 42' of FIG. 2) of a memory cell structure (e.g., MCAa of FIG. 1 or MCAb of FIG. 2), or for reading the data from the data storage material patterns 42. Operations of the row driver 1520 and the column driver 1530 may be controlled by the control logic 1540. The first structure 110F may be the lower structure (120 in FIG. 4) described with reference to FIGS. 3 to 5.

The second structure 1500U may include a plurality of memory cell structures stacked in a vertical direction.

In an example, the plurality of memory cell structures may include two memory cell structures MCA_1 and MCA_2, as illustrated in FIG. 4.

In an example, the plurality of memory cell structures may include two or more memory cell structures. For example, the plurality of memory cell structures may include first to fourth memory cell structures MCAa_1, MCAa_2, MCAa_3, and MCAa_4, stacked in a vertical direction. Each of the first to fourth memory cell structures MCAa_1, MCAa_2, MCAa_3, and MCAa_4 may include the data storage material pattern 42 and the selector material pattern 36, as illustrated in FIG. 1. In another example, each of the first to fourth memory cell structures MCAa_1, MCAa_2, MCAa_3, and MCAa_4 may include the data storage material patterns and the selector material patterns of various examples described with reference to FIGS. 2 to 7B.

An embodiment of inventive concepts may include a structure in which more than four memory cell structures are stacked in a vertical direction.

The second structure 1500U may further include first conductive lines CL1 disposed between the first memory cell structure MCAa_1 and the first structure 1500L and extending in a first horizontal direction, second conductive lines CL2 disposed between the first memory cell structure MCAa_1 and the second memory cell structure MCAa_2 and extending in a second horizontal direction, third conductive lines CL3 disposed between the second memory cell structure MCAa_2, and the third memory cell structure MCAa_3 and extending in a first horizontal direction, fourth conductive lines CL4 disposed between the third memory cell structure MCAa_3 and the fourth memory cell structure MCAa_4 and extending in a second horizontal direction, and fifth conductive lines CL5 disposed on the fourth memory cell structure MCAa_4 and extending in a first horizontal direction.

In an example, the first, third, and fifth conductive lines CL1, CL3, and CL5 may be word lines, and the second and fourth conductive lines CL2 and CL4 may be bit lines.

The second structure 1500U may include first, third, and fifth contact structures PL1, PL3, and PL5 electrically connecting the first, third, and fifth conductive lines CL1, CL3, and CL5 to the row driver 1520, and second and fourth contact structures PL2 and PL4 electrically connecting the second and fourth conductive lines CL2 and CL4 to the column driver 1530.

The second structure 1500U may include an input/output pad 1501. The semiconductor device 1500 may be electrically connected to the input/output pad 1501, may pass through the second structure 1500U, may extend into the first structure 1500L, and may further include an input/output contact structure PL6 electrically connected to the peripheral circuit 1540.

The semiconductor device 1500 may communicate with the controller 1600 through the input/output pad 1501 electrically connected to the peripheral circuit 1540. The controller 1600 may include a processor 1610, a memory controller 1622, and a host interface 1630. Depending on embodiments, the electronic system 1100 may include a plurality of semiconductor devices 1500. In this case, the controller 1600 may control the plurality of semiconductor devices 1500.

The processor 1610 may control an overall operation of the electronic system 1100 including the controller 1600. The processor 1610 may operate according to a desired and/or alternatively predetermined firmware, and may control the memory controller 1620 to access the semiconductor device 1500. The memory controller 1620 may include a memory interface 1621 that processes communication with the semiconductor device 1500.

Through the memory interface 1621, a control command for controlling the semiconductor device 1500, data to be written to data storage material patterns 42 of the memory cell structures MCAa_1, MCAa_2, MCAa_3, and MCAa_4 of the semiconductor device 1500, data to be read from the data storage material patterns 42 of the memory cell structures MCAa_1, MCAa_2, MCAa_3, and MCAa_4 of the semiconductor device 1500, or the like may be transmitted.

The host interface 1630 may provide a communication function between the electronic system 1100 and an external host. When a control command is received from the external host through the host interface 1630, the processor 1610 may control the semiconductor device 1500 in response to the control command.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to embodiments, a semiconductor device capable of improving at least one of integration, reliability, or durability thereof may be provided.

Various features and effects of inventive concepts are not limited to the above description, and may be more easily understood in the process of describing specific embodiments of inventive concepts.

While some example embodiments have been illustrated and described above, it will be apparent to those skilled in the art that modifications and variations may be made without departing from the scope of inventive concepts as defined by the appended claims.

What is claimed is:
1. A semiconductor device comprising:
a lower structure;
a first conductive line on the lower structure and extending in a first horizontal direction;
a second conductive line on the first conductive line and extending in a second horizontal direction, the second horizontal direction being perpendicular to the first horizontal direction; and
a memory cell structure between the first conductive line and the second conductive line, wherein
the memory cell structure includes a data storage material pattern and a selector material pattern overlapping the data storage material pattern in a vertical direction,
the data storage material pattern includes a phase change material layer of $In_\alpha Ge_\beta Sb_\gamma Te_\delta$ and a first additional phase change material layer overlapping the phase change material layer of $In_\alpha Ge_\beta Sb_\gamma Te_\delta$,
in the phase change material layer of $In_\alpha Ge_\beta Sb_\gamma Te_\delta$, a sum of $\alpha$ and $\beta$ is lower than about 30 at. %, and a sum of $\gamma$ and $\delta$ is higher than about 70 at. %, and
the first additional phase change material layer is a phase change material layer without In or a phase change material layer having a lower In content than the phase change material layer of $In_\alpha Ge_\beta Sb_\gamma Te_\delta$.

2. The semiconductor device of claim 1, wherein, in the phase change material layer of $In_\alpha Ge_\beta Sb_\gamma Te_\delta$,
the sum of $\alpha$ and $\beta$ is equal to or lower than about 20 at. %, and
the sum of $\gamma$ and $\delta$ is equal to or higher than about 80 at. %.

3. The semiconductor device of claim 2, wherein
$\gamma$ is about 30 at. %, and
$\delta$ is about 50 at. %.

4. The semiconductor device of claim 2, wherein a is equal to or higher than about 10 at. % and equal to or lower than about 20 at. %.

5. The semiconductor device of claim 4, wherein β is less than α.

6. The semiconductor device of claim 4, wherein
the data storage material pattern further comprises an additional element, and
the additional element is at least one of B, Al, Ga, In, Tl, C, Si, Ge, Sn, N, P, As, Sb, Bi, O, S, Se, Te, Zn, Cd, W, Ti, Hf, or Zr.

7. The semiconductor device of claim 1, wherein
the data storage material pattern further comprises a second additional phase change material layer,
the phase change material layer of $In_\alpha Ge_\beta Sb_\gamma Te_\delta$ is between the first additional phase change material layer and the second additional phase change material layer,
the second additional phase change material layer is a phase change material layer without In or a phase change material layer having a lower In content than the phase change material layer of $In_\alpha Ge_\beta Sb_\gamma Te_\delta$.

8. The semiconductor device of claim 1, wherein
the lower structure comprises a semiconductor substrate, a circuit device on the semiconductor substrate, and a lower insulating structure on the semiconductor substrate and covering the circuit device.

9. A semiconductor device comprising:
a lower structure including a semiconductor substrate, a circuit device on the semiconductor substrate, and a lower insulating structure on the semiconductor substrate and covering the circuit device; and
a plurality of memory cell structures on the lower structure and stacked in a vertical direction, wherein
the plurality of memory cell structures include a data storage material pattern and a selector material pattern overlapping the data storage material pattern in the vertical direction, respectively,
the data storage material pattern includes a phase change material layer of $In_\alpha Ge_\beta Sb_\gamma Te_\delta$ and an additional phase change material layer overlapping the phase change material layer of $In_\alpha Ge_\beta Sb_\gamma Te_\delta$, and
in the phase change material layer of $In_\alpha Ge_\beta Sb_\gamma Te_\delta$, a sum of α and β is lower than about 30 at. %, and a sum of γ and δ is higher than about 70 at. %, and
the additional phase change material layer is a phase change material layer without In or a phase change material layer having a lower In content than the phase change material layer of $In_\alpha Ge_\beta Sb_\gamma Te_\delta$.

10. The semiconductor device of claim 9, wherein, in the phase change material layer of $In_\alpha Ge_\beta Sb_\gamma Te_\delta$,
the sum of α and β is equal to or lower than about 20 at. %, and
the sum of γ and δ is equal to or higher than about 80 at. %.

11. The semiconductor device of claim 10, wherein
γ is about 30 at. %, and
δ is about 50 at. %.

12. The semiconductor device of claim 10, wherein a is equal to or higher than about 10 at. % and equal to or lower than about 20 at. %.

13. A semiconductor device comprising:
a lower structure including a row driver, a column driver, and a control logic electrically connected to the row driver and the column driver; and
an upper structure on the lower structure, wherein the upper structure includes a first conductive line on the lower structure, a second conductive line on the first conductive line, and a first memory cell structure between the first conductive line and the second conductive line;
a first contact structure electrically connecting the first conductive line to the row driver;
a second contact structure electrically connecting the second conductive line to the column driver; and
an input/output contact structure passing through the upper structure and extending into the lower structure, the input/output contact structure being electrically connected to the control logic, wherein
the first memory cell structure includes a data storage material pattern and a selector material pattern overlapping the data storage material pattern in a vertical direction,
the data storage material pattern includes a phase change material layer of $In_\alpha Ge_\beta Sb_\gamma Te_\delta$ and an additional phase change material layer overlapping the phase change material layer of $In_\alpha Ge_\beta Sb_\gamma Te_\delta$,
in the phase change material layer of $In_\alpha Ge_\beta Sb_\gamma Te_\delta$, a sum of α and β is lower than about 30 at. %, and a sum of γ and δ is higher than about 70 at. %,
the additional phase change material layer is a phase change material layer without In or a phase change material layer having a lower In content than the phase change material layer of $In_\alpha Ge_\beta Sb_\gamma Te_\delta$.

14. The semiconductor device of claim 13, wherein
the first memory cell structure further comprises a lower electrode pattern between the first conductive line and the selector material pattern, an intermediate electrode pattern between the selector material pattern and the data storage material pattern, and an upper electrode pattern between the data storage material pattern and the second conductive line, and
in the phase change material layer of $In_\alpha Ge_\beta Sb_\gamma Te_\delta$, the sum of α and β is equal to or lower than about 20 at. %, and the sum of γ and δ is equal to or higher than about 80 at. %.

15. The semiconductor device of claim 14, wherein
γ is about 30 at. %, and
δ is about 50 at. %.

16. The semiconductor device of claim 14, wherein a is equal to or higher than about 10 at. % and equal to or lower than about 20 at. %.

17. The semiconductor device of claim 14, wherein
the selector material pattern is a threshold switching element,
the first conductive line has a first thickness,
the second conductive line has a second thickness,
the second thickness is more than two times the first thickness and less than three times the first thickness,
the selector material pattern has a thickness of about 100 Å to about 200 Å, and
the data storage material pattern has a thickness of about 300 Å to about 450 Å.

* * * * *